United States Patent
Kim et al.

(10) Patent No.: US 7,716,553 B2
(45) Date of Patent: May 11, 2010

(54) SYSTEM AND METHOD FOR DESIGNING RS-BASED LDPC CODE DECODER

(75) Inventors: Sang-Min Kim, Minneapolis, MN (US); Keshab K. Parhi, Maple Grove, MN (US); Renfei Liu, Minneapolis, MN (US)

(73) Assignee: Leanics Corporation, Maple Grove, MN (US)

( * ) Notice: Subject to any disclaimer, the term of this patent is extended or adjusted under 35 U.S.C. 154(b) by 971 days.

(21) Appl. No.: 11/487,042

(22) Filed: Jul. 13, 2006

(65) Prior Publication Data

US 2007/0033484 A1 Feb. 8, 2007

Related U.S. Application Data

(60) Provisional application No. 60/699,170, filed on Jul. 13, 2005.

(51) Int. Cl.
  *H03M 13/00* (2006.01)
(52) U.S. Cl. .................. 714/755; 714/786; 714/784; 714/805; 714/763
(58) Field of Classification Search ............ 714/784, 714/755, 786, 756, 805, 763, 757
See application file for complete search history.

(56) References Cited

U.S. PATENT DOCUMENTS 6,965,652 B1 * 11/2005 Burd et al. ............... 375/341
7,266,750 B1 *  9/2007 Patapoutian et al. ...... 714/758
7,555,696 B2 *  6/2009 Schmidt .................. 714/758

OTHER PUBLICATIONS

Zhang, T. and Parhi, K., "Joint (3,k)-Regular LDPC Code and Decoder/Encoder Design", IEEE Transactions on Signal Processing, vol. 52, No. 4, Apr. 2004, pp. 1065-1079.

Djurdjevic, I. et al., "A Class of Low-Density Parity-Check Codes Constructed Based on Reed-Solomon Codes with Two Information Symbols", IEEE Communications Letters, vol. 7, No. 7, Jul. 2003, pp. 317-319.

* cited by examiner

*Primary Examiner*—Guy J Lamarre

(57) ABSTRACT

A memory address generation method and circuit architecture for time-multiplexed RS-based LDPC code decoder is presented. The method is developed for non quasi-cyclic RS-based LDPC code decoder implementation. A circuit for the memory address generation method achieves low area. High throughput time-multiplexed RS-based LDPC code decoder design models and circuit architectures are presented. The decoder models are specifically developed for 10BASE-T (10-Gigabit Ethernet Transceiver Over Copper) system. These time-multiplexed architectures enable higher throughput with lower area.

26 Claims, 24 Drawing Sheets

Table 1

| Coset | Message | Code word | Symbol Location Vector |
|---|---|---|---|
| $C_s^1$ | $(0,0)$ | $(0,0,0)$ | $(1\,0\,0\,0\ \ 1\,0\,0\,0\ \ 1\,0\,0\,0)$ |
| | $(1,1)$ | $(\alpha,\alpha^2,1)$ | $(0\,0\,1\,0\ \ 0\,0\,0\,1\ \ 0\,1\,0\,0)$ |
| | $(\alpha,\alpha)$ | $(\alpha^2,1,\alpha)$ | $(0\,0\,0\,1\ \ 0\,1\,0\,0\ \ 0\,0\,1\,0)$ |
| | $(\alpha^2,\alpha^2)$ | $(1,\alpha,\alpha^2)$ | $(0\,1\,0\,0\ \ 0\,0\,1\,0\ \ 0\,0\,0\,1)$ |
| $C_s^2$ | $(1,0)$ | $(\alpha,1,0)$ | $(0\,0\,1\,0\ \ 0\,1\,0\,0\ \ 1\,0\,0\,0)$ |
| | $(0,1)$ | $(0,\alpha,1)$ | $(1\,0\,0\,0\ \ 0\,0\,1\,0\ \ 0\,1\,0\,0)$ |
| | $(\alpha^2,\alpha)$ | $(1,0,\alpha)$ | $(0\,1\,0\,0\ \ 1\,0\,0\,0\ \ 0\,0\,1\,0)$ |
| | $(\alpha,\alpha^2)$ | $(\alpha^2,\alpha^2,\alpha^2)$ | $(0\,0\,0\,1\ \ 0\,0\,0\,1\ \ 0\,0\,0\,1)$ |
| $C_s^3$ | $(\alpha,0)$ | $(\alpha^2,\alpha,0)$ | $(0\,0\,0\,1\ \ 0\,0\,1\,0\ \ 1\,0\,0\,0)$ |
| | $(\alpha^2,1)$ | $(1,1,1)$ | $(0\,1\,0\,0\ \ 0\,1\,0\,0\ \ 0\,1\,0\,0)$ |
| | $(0,\alpha)$ | $(0,\alpha^2,\alpha)$ | $(1\,0\,0\,0\ \ 0\,0\,0\,1\ \ 0\,0\,1\,0)$ |
| | $(1,\alpha^2)$ | $(\alpha,0,\alpha^2)$ | $(0\,0\,1\,0\ \ 1\,0\,0\,0\ \ 0\,0\,0\,1)$ |
| $C_s^4$ | $(\alpha^2,0)$ | $(1,\alpha^2,0)$ | $(0\,1\,0\,0\ \ 0\,0\,0\,1\ \ 1\,0\,0\,0)$ |
| | $(\alpha,1)$ | $(\alpha^2,0,1)$ | $(0\,0\,0\,1\ \ 1\,0\,0\,0\ \ 0\,1\,0\,0)$ |
| | $(1,\alpha)$ | $(\alpha,\alpha,\alpha)$ | $(0\,0\,1\,0\ \ 0\,0\,1\,0\ \ 0\,0\,1\,0)$ |
| | $(0,\alpha^2)$ | $(0,1,\alpha^2)$ | $(1\,0\,0\,0\ \ 0\,1\,0\,0\ \ 0\,0\,0\,1)$ |

Table 2

| | | Clock cycle | Iteration | S | Address generated by MAG | Messages triggered by MAG |
|---|---|---|---|---|---|---|
| Initialization step | | | | | All memories are initialized to the value of the intrinsic message | |
| Iterative decoding step | CNU processing | 1 | 1st | 1 | (00,00,00) | $a1_{1,1}, a1_{1,2}, a1_{1,3}$ for CNU1 |
| | | | | | (10,01,00) | $a1_{2,1}, a1_{2,2}, a1_{2,3}$ for CNU2 |
| | | | | | (11,10,00) | $a1_{3,1}, a1_{3,2}, a1_{3,3}$ for CNU3 |
| | | 2 | | | (10,11,01) | $a2_{1,1}, a2_{1,2}, a2_{1,3}$ for CNU1 |
| | | | | | (00,10,01) | $a2_{2,1}, a2_{2,2}, a2_{2,3}$ for CNU2 |
| | | | | | (01,01,01) | $a2_{3,1}, a2_{3,2}, a2_{3,3}$ for CNU3 |
| | | 3 | | | (11,01,10) | $a3_{1,1}, a3_{1,2}, a3_{1,3}$ for CNU1 |
| | | | | | (01,00,10) | $a3_{2,1}, a3_{2,2}, a3_{2,3}$ for CNU2 |
| | | | | | (00,11,10) | $a3_{3,1}, a3_{3,2}, a3_{3,3}$ for CNU3 |
| | | 4 | | | (01,10,11) | $a4_{1,1}, a4_{1,2}, a4_{1,3}$ for CNU1 |
| | | | | | (11,11,11) | $a4_{2,1}, a4_{2,2}, a4_{2,3}$ for CNU2 |
| | | | | | (10,00,11) | $a4_{3,1}, a4_{3,2}, a4_{3,3}$ for CNU3 |
| | VNU processing | 5 | | 0 | (00,00,00) | $I_1, a1_{1,1}, a2_{2,1}, a3_{3,1}$ for VNU1 |
| | | | | | (00,00,00) | $I_5, a1_{1,2}, a3_{2,2}, a4_{3,2}$ for VNU2 |
| | | | | | (00,00,00) | $I_9, a1_{1,3}, a1_{2,3}, a1_{3,3}$ for VNU3 |
| | | 6 | | | (01,01,01) | $I_2, a4_{1,1}, a3_{2,1}, a2_{3,1}$ for VNU1 |
| | | | | | (01,01,01) | $I_6, a3_{1,2}, a1_{2,2}, a2_{3,2}$ for VNU2 |
| | | | | | (01,01,01) | $I_{10}, a2_{1,3}, a2_{2,3}, a2_{3,3}$ for VNU3 |
| | | 7 | | | (10,10,10) | $I_3, a2_{1,1}, a1_{2,1}, a4_{3,1}$ for VNU1 |
| | | | | | (10,10,10) | $I_7, a4_{1,2}, a2_{2,2}, a1_{3,2}$ for VNU2 |
| | | | | | (10,10,10) | $I_{11}, a3_{1,3}, a3_{2,3}, a3_{3,3}$ for VNU3 |
| | | 8 | | | (11,11,11) | $I_4, a3_{1,1}, a4_{2,1}, a1_{3,1}$ for VNU1 |
| | | | | | (11,11,11) | $I_8, a2_{1,2}, a4_{2,2}, a3_{32}$ for VNU2 |
| | | | | | (11,11,11) | $I_{12}, a4_{1,3}, a4_{2,3}, a4_{3,3}$ for VNU3 |

Table 3

| | | First design | Second design | | Third design |
|---|---|---|---|---|---|
| | | | FCA | FVA | |
| Area of Processing Units | | | | | |
| Number of CNU's | | 384 | 64 | | 192 |
| CNU | LUT | 3 | 32 | | 6 |
| | Adder | 3 | 63 | | 6 |
| | ex-OR | 3 | 63 | | 6 |
| Number of VNU's | | 192 | 384 | | 192 |
| VNU | LUT | 6 | 6 | | 6 |
| | Adder | 12 | 12 | | 12 |
| Number of SSAU's | | 384 | 0 | | 384 |
| SSAU | LUT | 3 | . | | 3 |
| | Adder | 3 | . | | 3 |
| | ex-OR | 3 | . | | 3 |
| Total number | LUT's | 3456 | 4352 | | 3456 |
| | Adders | 4608 | 8640 | | 4608 |
| | ex-OR's | 2304 | 4032 | | 2304 |
| | Registers | 4416 | 9088 | | 9024 |
| Shuffle network's Complexity | | | | | |
| Switch network | de-MUX | 1920 (1-to-11) | 3200 (1-to-6) 640 (1-to-2) | 3968 (1-to-6) | 1920 (1-to-12) |
| | wires | 21120 | 20480 | 23808 | 23040 |
| Memory for extrinsic messages | | 11×1152 | 192  1×64 | | 12×1152 |

$$H = \begin{bmatrix} A_1 \\ A_2 \\ A_3 \end{bmatrix} = \begin{bmatrix} 1 & 0 & 0 & 0 & 1 & 0 & 0 & 0 & 1 & 0 & 0 & 0 \\ 0 & 0 & 1 & 0 & 0 & 0 & 0 & 1 & 0 & 1 & 0 & 0 \\ 0 & 0 & 0 & 1 & 0 & 1 & 0 & 0 & 0 & 0 & 1 & 0 \\ 0 & 1 & 0 & 0 & 0 & 0 & 1 & 0 & 0 & 0 & 0 & 1 \\ \hline 0 & 0 & 1 & 0 & 0 & 1 & 0 & 0 & 1 & 0 & 0 & 0 \\ 1 & 0 & 0 & 0 & 0 & 0 & 1 & 0 & 0 & 1 & 0 & 0 \\ 0 & 1 & 0 & 0 & 1 & 0 & 0 & 0 & 0 & 0 & 1 & 0 \\ 0 & 0 & 0 & 1 & 0 & 0 & 0 & 1 & 0 & 0 & 0 & 1 \\ \hline 0 & 0 & 0 & 1 & 0 & 0 & 1 & 0 & 1 & 0 & 0 & 0 \\ 0 & 1 & 0 & 0 & 0 & 1 & 0 & 0 & 0 & 1 & 0 & 0 \\ 1 & 0 & 0 & 0 & 0 & 0 & 0 & 1 & 0 & 0 & 1 & 0 \\ 0 & 0 & 1 & 0 & 1 & 0 & 0 & 0 & 0 & 0 & 0 & 1 \end{bmatrix}$$

Fig. 1

$$
\begin{array}{c|cc}
& \underline{DO} & \underline{Coset} \\
C_s^1 \;+ & (\alpha,1,0) & = & C_s^2 \\
& (\alpha^2,\alpha,0) & = & C_s^3 \\
& (1,\alpha^2,0) & = & C_s^4
\end{array}
\;\Rightarrow\;
\begin{array}{c}
C_s^1 \\
(0,0,0) \\
(\alpha,\alpha^2,1) \\
(\alpha^2,1,\alpha) \\
(1,\alpha,\alpha^2)
\end{array}
$$

$$
+\;(\alpha,1,0)\;=\;
\begin{array}{c}
C_s^2 \\
(\alpha,1,0) \\
(0,\alpha,1) \\
(1,0,\alpha) \\
(\alpha^2,\alpha^2,\alpha^2)
\end{array}
$$

$$
+\;(\alpha^2,\alpha,0)\;=\;
\begin{array}{c}
C_s^3 \\
(\alpha^2,\alpha,0) \\
(1,1,1) \\
(0,\alpha^2,\alpha) \\
(\alpha,0,\alpha^2)
\end{array}
$$

$$
+\;(1,\alpha^2,0)\;=\;
\begin{array}{c}
C_s^4 \\
(1,\alpha^2,0) \\
(\alpha^2,0,1) \\
(\alpha,\alpha,\alpha) \\
(0,1,\alpha^2)
\end{array}
$$

Fig. 3

$$H = \begin{bmatrix} A_1 \\ A_2 \\ A_3 \end{bmatrix} = \begin{bmatrix} a_{1,1} & a_{1,2} & a_{1,3} \\ a_{2,1} & a_{2,2} & a_{2,3} \\ a_{3,1} & a_{3,2} & a_{3,3} \end{bmatrix}$$

(a) Parity-check matrix of Fig. 1

$$A_1 = \begin{bmatrix} a1_{1,1} & 0 & 0 & 0 & a1_{1,2} & 0 & 0 & 0 & a1_{1,3} & 0 & 0 & 0 \\ 0 & 0 & a2_{1,1} & 0 & 0 & 0 & 0 & a2_{1,2} & 0 & a2_{1,3} & 0 & 0 \\ 0 & 0 & 0 & a3_{1,1} & 0 & a3_{1,2} & 0 & 0 & 0 & 0 & a3_{1,3} & 0 \\ 0 & a4_{1,1} & 0 & 0 & 0 & 0 & a4_{1,2} & 0 & 0 & 0 & 0 & a4_{1,3} \end{bmatrix}$$

| $a1_{1,1}$ | $a4_{1,1}$ | $a2_{1,1}$ | $a3_{1,1}$ | $a1_{1,2}$ | $a3_{1,2}$ | $a4_{1,2}$ | $a2_{1,2}$ | $a1_{1,3}$ | $a2_{1,3}$ | $a3_{1,3}$ | $a4_{1,3}$ |

(b) Mapping $A_1$ into memory blocks

Fig. 4

(a) Folding by $F_C=1$ and $F_V=11$

| Clock cycles | | 1 | 2 | 3 | 4 | 5 | 6 | 7 | 8 | 9 | 10 | 11 | 12 | 13 | 14 | 15 | 16 | 17 | .... |
|---|---|---|---|---|---|---|---|---|---|---|---|---|---|---|---|---|---|---|---|
| CNU | Memory Read | A | B | C | D | E | F | G | H | I | J | K | | | A | B | C | D | |
| | Logic | | A | B | C | D | E | F | G | H | I | J | K | | | A | B | C | |
| VNU | Logic | | | A | B | C | D | E | F | G | H | I | J | K | | | A | B | .... |
| | Memory Write | | | | A | B | C | D | E | F | G | H | I | J | K | | | A | |
| SSAU | Logic | | | | A | B | C | D | E | F | G | H | I | J | K | | | A | |

|←——————— One iteration ———————→|

(b) Decoder schedule

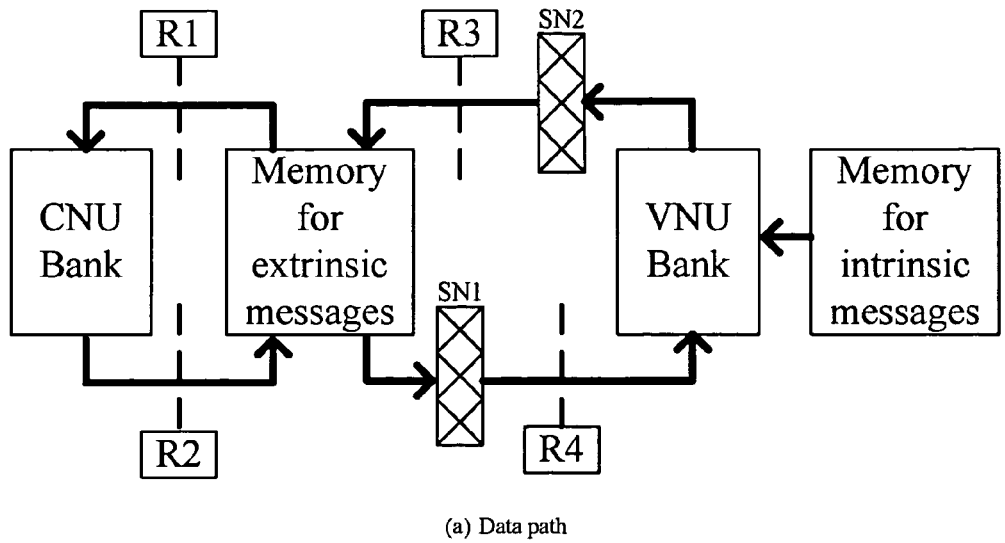
(a) Data path
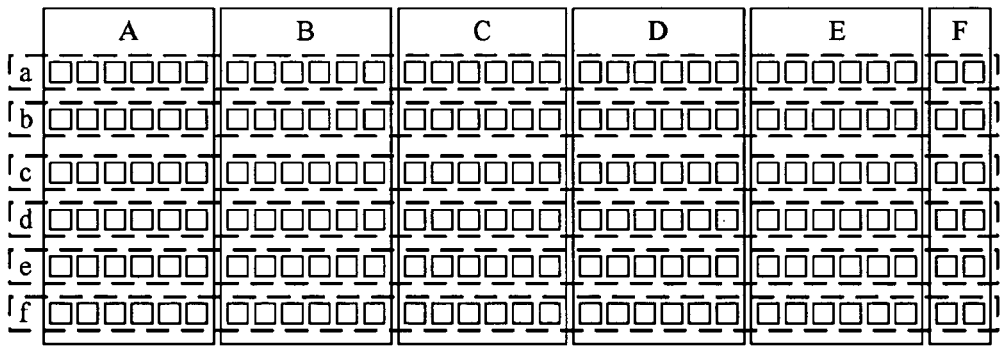
(b) Folding by $F_C=6$ and $F_V=6$
| Clock cycles | | 1 | 2 | 3 | 4 | 5 | 6 | 7 | 8 | 9 | 10 | 11 | 12 | 13 | 14 | 15 | 16 | 17 | .... |
|---|---|---|---|---|---|---|---|---|---|---|---|---|---|---|---|---|---|---|---|
| CNU | Memory Read | a | b | c | d | e | f | | | | | | | | | | | a | |
| | Logic | | a | b | c | d | e | f | | | | | | | | | | | |
| | Memory Write | | | a | b | c | d | e | f | | | | | | | | | | |
| VNU | Memory Read | | | | | | | | | | A | B | C | D | E | F | | | .... |
| | Logic | | | | | | | | | | | A | B | C | D | E | F | | |
| | Memory Write | | | | | | | | | | | | A | B | C | D | E | F | |
One iteration
(c) Decoder schedule
Fig. 13

(a) Folding by $F_C=2$ and $F_V=11$

| Clock cycles | | 1 | 2 | 3 | 4 | 5 | 6 | 7 | 8 | 9 | 10 | 11 | 12 | 13 | 14 | 15 | 16 | 17 | .... |
|---|---|---|---|---|---|---|---|---|---|---|---|---|---|---|---|---|---|---|---|
| CNU | Memory Read | A1 | A2 | B1 | B2 | C1 | C2 | D1 | D2 | E1 | E2 | F1 | F2 | | | A1 | A2 | B1 | |
| | Logic | | A1 | A2 | B1 | B2 | C1 | C2 | D1 | D2 | E1 | E2 | F1 | F2 | | | A1 | A2 | .... |
| VNU | Logic | | | | a | b | c | d | e | f | g | h | i | j | k | | | | .... |
| | Memory Write | | | | | a | b | c | d | e | f | g | h | i | j | k | | | |
| SSAU | Logic | | | | | a | b | c | d | e | f | g | h | i | j | k | | | |

⟵────── One iteration ──────⟶

(b) Decoder schedule

| Clock cycles | 1 | 2 | 3 | 4 | 5 | 6 | 7 | 8 | 9 | 10 | 11 | 12 | 13 | 14 | 15 | 16 | 17 |
|---|---|---|---|---|---|---|---|---|---|---|---|---|---|---|---|---|---|
| R1 | A1 | A2 | B1 | B2 | C1 | C2 | D1 | D2 | E1 | E2 | F1 | F2 | | | A1 | A2 | B1 |
| R2 | | A1 | A2 | B1 | B2 | C1 | C2 | D1 | D2 | E1 | E2 | F1 | F2 | | | A1 | A2 |
| R3 | | | A1 | A2 | B1 | B2 | C1 | C2 | D1 | D2 | E1 | E2 | F1 | F2 | | | |
| R4 | | | | A1 | A2 | B1 | B2 | C1 | C2 | D1 | D2 | E1 | E2 | F1 | F2 | | |
| R5 | | | | | a | b | c | d | e | f | g | h | i | j | k | | |
| R6 | | | | | | a | b | c | d | e | f | g | h | i | j | k | |
| R7 | | | | | | | a | b | c | d | e | f | g | h | i | j | k |
| Switch 1 | | | | D | U | D | U | D | U | D | U | D | U | D | U | | |
| Switch 2 | | | | | | D | U | D | U | D | U | D | U | D | U | U | |

D : DOWN
U : UP

Fig. 21

SYSTEM AND METHOD FOR DESIGNING RS-BASED LDPC CODE DECODER

CROSS-REFERENCE TO RELATED APPLICATIONS

This application claims the benefit of the U.S. Provisional Application No. 60/699,170 filed Jul. 13, 2005, which is incorporated herein by reference in its entirety.

STATEMENT REGARDING FEDERALLY-SPONSORED RESEARCH AND DEVELOPMENT

This invention was made with Government support from the National Science Foundation (NSF) under Grant No. DMI-0441632, *SBIR Phase I: Design of a 10-Gigabit Ethernet Transceiver Over Copper.*

FIELD OF THE INVENTION

The present invention relates to data processing and transmission, and digital communication. More specifically, it is related to decoder design for error correcting codes.

BACKGROUND OF THE INVENTION

Low-Density Parity-Check (LDPC) codes with iterative decoding based on belief propagation algorithm (also known as the sum-product (SP) algorithm) have excellent error correcting capability approaching the Shannon limit. Moreover, very high decoding throughput can be achieved since the SP decoding algorithm is inherently fully parallelizable.

Recently, LDPC codes have been adopted as the FEC (forward error correction) coding scheme for many digital communication standards. In particular, the RS (Reed-Solomon)-based LDPC code (see, I. Djurdjevic, J. Xu, K. Abdel-Ghaffar, and S. Lin, "A class of low-density parity-check codes constructed based on Reed-Solomon codes with two information symbols," IEEE Communications Letters, Vol. 7, pp. 317-319, 2003) has been adopted to be used in 10 Gigabit Ethernet over copper (10GBASE-T). The RS-based LDPC codes are constructed based on an algebraic method. This method is based on the structure of Reed-Solomon codes with two information symbols. Constructed RS-based LDPC codes are free of cycles of length 4 and have good minimum distances. For example, a regular (2048, 1723) RS-based LDPC code whose column and row weights are 6 and 32 has at least 8 minimum distance. At the BER (bit error rate) of $10^{-6}$ assuming BPSK (binary phase shift keying) transmission over an AWGN (additive white gaussian noise) channel, the code performs at a distance of 1.55 dB from the Shannon limit and achieves a 6 dB coding gain over the uncoded BPSK.

LDPC codes are identified by parity-check matrices and LDPC code decoder complexity depends on the structure pattern of the parity-check matrix. In other words, if a parity-check matrix has a specific regular pattern, it can be used to design a low complexity decoder architecture. The parity-check matrix of the RS-based LDPC codes is simple in structure since it consists of square matrices. However, if a constraint such that the row weight of parity-check matrix is equal to the size of submatrix is not satisfied, these submatrices do not result in circulant matrices, i.e., each submatrix is not cyclically shifted version of identity matrix. In this case, it may appear that the parity-check matrix doesn't have any kind of regular pattern. Thus this fact makes it hard to derive an efficient memory address generation (MAG) scheme for the time-multiplexed (TM) RS-based LDPC decoder architectures (for the TM LDPC decoder architecture, see, T. Zhang and K. K. Parhi, "Joint (3,k)-regular LDPC code and decoder/encoder design," IEEE Trans. Acoust., Speech, Signal Processing, Vol. 52, pp. 1065-1079, April 2004) though a simple MAG scheme is essential for any kind of TM LDPC code decoder architecture.

For high decoding throughput applications such as the 10GBASE-T, it may be difficult to implement a RS-based LDPC decoder based on the TM decoder architecture since the number of clock cycles required per each iteration in the architecture is directly proportional to the size of the submatrix. For example, the RS-based LDPC code used in the 10GBASE-T has 64×64 submatrix and 128 (=2*64) clock cycles are required per each iteration. In addition, since a large volume of messages are passed between memories and processing units, the number of required processing units is significantly large. Thus, a methodology for designing new TM RS-based LDPC code decoders oriented for high decoding throughput should be developed, which can leads to a low-cost decoder architecture.

What is needed is a new MAG scheme for the TM RS-based LDPC code decoder and a methodology that leads to low cost decoder architectures allowing high throughput.

BRIEF SUMMARY OF THE INVENTION

The present invention provides an efficient MAG scheme for the TM RS-based LDPC code decoders, and describes a method for designing a low cost TM RS-based LDPC code decoders allowing high decoding throughput.

In accordance with the present invention, first, a new MAG scheme for the TM RS-based LDPC code decoders is derived by exploiting an inherent characteristic of the parity-check matrices of RS-based LDPC codes. The parity-check matrices can be partitioned into cosets and the cosets have specific constant offset values with one another. This unique feature is directly used to develop an efficient MAG scheme working best with the TM decoder architectures. Second, a design methodology for TM RS-based LDPC code decoders supporting high throughput system applications such as the 10GBASE-T is presented, in which a sum and sign accumulation unit (SSAU) is used which results not only in hardware cost reduction of check node processing unit (CNU) but also leads to an interlaced decoding scheduling leading to fewer clock cycles required per decoding iteration. The use of the SSAU for CNU processing is an important aspect of the proposed invention. In addition, a shuffle network establishing connections between messages and processing units is presented which consists of switch network composed of deMux's (demultiplexers) and routing blocks to reduce the latency.

Further embodiments, features, and advantages of the present invention, as well as the structure and operation of the various embodiments of the present invention are described in detail below with reference to the accompanying drawings.

BRIEF DESCRIPTION OF THE DRAWINGS/FIGURES

The present invention is described with reference to the accompanying figures. The accompanying figures, which are incorporated herein and form part of the specification, illustrate the present invention and, together with the description, further serve to explain the principles of the invention and to enable a person skilled in the relevant art to make and use the invention.

Table 1 lists 16 code words of the (3,2) cyclic RS code over $GF(2^2)$ and their symbol location vector (SLV) representations.

Table 2 shows a detailed schedule of the architecture shown in FIG. 5.

Table 3 lists the complexity for three different TM RS-based LDPC code decoder architectures.

FIG. 1 illustrates a RS-based (3,3)-regular LDPC code.

FIG. 3 illustrates the feature of parity-check matrix of RS-based LDPC codes.

FIG. 4 illustrates how to map each submatrix of RS-based LDPC codes into memory block.

FIG. 13 illustrates data path, how the partitioning of parity-check matrix for $F_C$=6, $F_V$=6 and the corresponding decoder schedule.

FIG. 21 illustrates overall register data flow.

DETAILED DESCRIPTION OF THE INVENTION

Background on RS-Based LDPC codes

The RS-based LDPC codes are derived from shortened RS codes with two information symbols. Consider RS codes with symbols from the Galois field $GF(p^m)$ where p is a prime number and m is a positive integer. Let $q=p^m$ and $\alpha$ be a primitive element in GF(q). The generator polynomial of a primitive RS code of length q−1 and minimum distance ρ−1, where $2 \leq \rho < q$, is given by:

$$g(X) = (X + \alpha)(X + \alpha^2) \cdots (X + \alpha^{\rho-2}), \quad \text{EQ. (1)}$$
$$= g_0 + g_1 X + g_2 X^2 + \cdots + g_{\rho-3} X^{\rho-3} + X^{\rho-2},$$

where $g_i \in GF(q)$. The code generated by g(X) is the (q−1,q−ρ+1) cyclic RS code C.

The generator matrix G of C is a (q−ρ+1)×(q−1) matrix. Then a (ρ,2) shortened RS code $C_s$ with two information symbols is obtained by a shortened generator matrix $G_s$. $G_s$ is the first two rows of G, i.e., $$G_s = \begin{bmatrix} g_0 & g_1 & g_2 & \cdots & 1 & 0 \\ 0 & g_0 & g_1 & g_2 & \cdots & 1 \end{bmatrix}.$$

$G_s$ generates a codeword $c=(c_1, c_2, \ldots, c_\rho)$ of $C_s$. Each component $c_j$ is one of the $p^m$ elements, $0, \alpha^0, \alpha^1, \ldots, \alpha^{p^m-2}$, of $GF(p^m)$ and can be represented by location vector $z(c_j)$, where $z=(0, z_0, \ldots, z_{p^m-2})$ is a $p^m$-tuple over GF(2) and $z_i$ corresponds to $\alpha^i$ for $i=0, 1, \ldots, p^m-2$. For example, let $c_1=\alpha$, then $z(c_1)=(0\ 0\ 1\ 0)$. By this way, c is expressed by a $\rho p^m$-tuple over GF(2), $$Z(c)=(z(c_1), z(c_2), \ldots, z(c_\rho)), \quad \text{EQ.(2)}$$

which is called the symbol location vector (SLV) of c.

$C_s$ and SLV play key roles to construct RS-based LDPC codes. $C_s$ can be partitioned into $p^m$ cosets based on the subcode $C_s^1$. $\{C_s^1, C_s^2, \ldots, C_s^{p^m}\}$ denote $p^m$ cosets of $C_s$. First, $C_s^1$ is constructed such that $$C_s^1=\{\beta c : \beta \in GF(p^m)\}, \quad \text{EQ.(3)}$$

where c is a codeword in $C_s$ with weight ρ. To find such a codeword c, the first row is subtracted from the second row in $G_s$. Then the others, i.e., $C_s^i$ for $2 \leq i \leq p^m$, are constructed such that any two codewords in any coset $C_s^i$ should differ in every location.

Consider the following $\gamma p^m \times \rho p^m$ matrix over GF(2), where γ is a positive integer such that $1 \leq \gamma \leq p^m$:

$$H(\gamma) = \begin{bmatrix} A_1 \\ \vdots \\ A_\gamma \end{bmatrix},$$

where $A_i$ is a $p^m \times \rho p^m$ matrix over GF(2) whose rows are the $p^m$ SLV's of $Z(C_s^i)$, where $Z(C_s^i)$ is the set of SLV's of the $p^m$ codewords in the coset $C_s^i$. $A_i$ is a (1,ρ)-regular matrix with column and row weights of 1 and ρ, respectively. Note that H(γ) is the parity-check matrix of a (γ,ρ)-regular LDPC code. Therefore, the null space of this matrix gives a (γ,ρ)-regular RS-based LDPC code whose minimum distance is at least γ+1.

Figure 2:
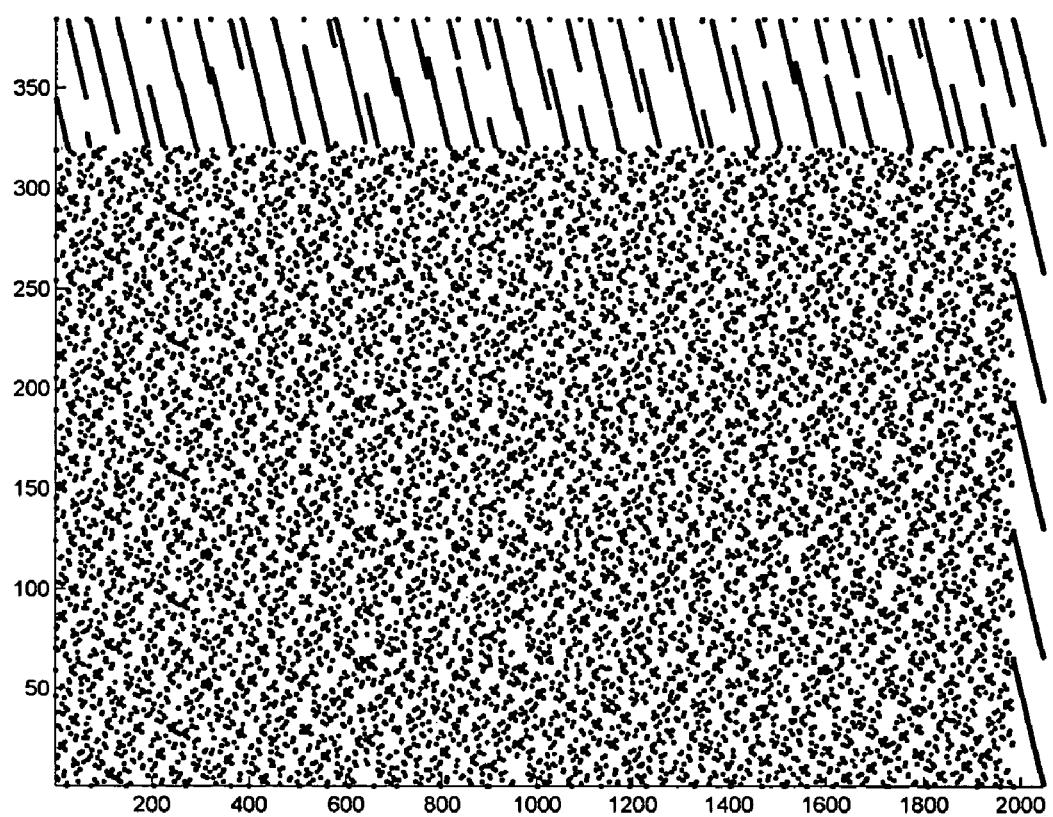
FIG. 2 illustrates a (2048,1723) RS-based (6,32)-regular LDPC code.

A RS-based (3,3)-regular LDPC code of length 12, rate-1/3 and minimum distance 6 can be constructed from (3,2) cyclic RS code over $GF(2^2)$. Table 1 lists $p^{2m}=16$ code words of (3,2) cyclic RS code and their SLV's. By choosing 3 cosets's SLV's, the parity-check matrix H of the (3,3)-regular RS-based LDPC code is obtained as shown in FIG. 1. The null space of the H leads to the RS-based (3,3)-regular LDPC code. FIG. 2 shows a parity-check matrix of a (6,32)-regular RS-based LDPC code of length 2048, dimension 1723, rate-0.841, and minimum distance of at least 8 constructed from the (32,2) cyclic RS code over $GF(2^6)$. Note that the (2048, 1723) RS-based (6,32)-regular LDPC code is adopted for the channel coding scheme by the IEEE 802.3an standard for the 10GBASE-T.

A Method to Design Memory Address Generation Block for RS-Based LDPC Code Decoders LDPC code is a class of linear block code with a binary sparse M×N parity-check matrix H, and is typically described by a bipartite graph, usually called Tanner graph, between N variable nodes on one side and M check nodes on the other side. LDPC codes can be effectively decoded by the SP decoding algorithm. The structure of the SP decoding algorithm directly matches the Tanner graph. In the decoding process, messages are computed on each variable node and check node and iteratively exchanged along the graph edges between the neighboring nodes, where each edge corresponds to a non-zero entry in the parity-check matrix H. The non-zero entries are mapped into memories and the memories communicate with processing units, CNU's (check node processing units) and VNU's (variable node processing units), based on the edges of the graph. Therefore, the pattern of the non-zero entries highly influences the complexity of the control method for MAG. If an LDPC code is constructed randomly, it is very hard to generate memory address efficiently with simple control logic and small memory.

The parity-check matrix of RS-based LDPC codes has a simple structure since it is composed of square matrices. However, as shown in FIG. 1 and FIG. 2, for some LDPC codes, submatrices are not circulant and it is hard to design an efficient MAG scheme for these codes. In fact, if $p^m$ is not equal to $\rho$, i.e., the row weight of the parity-check matrix is not equal to the submatrix's size, the submatrices are not circulant matrices in RS-based LDPC codes. Nevertheless, an efficient MAG method can be derived by exploring the following property of the parity-check matrix of the RS-based LDPC codes:

$$\text{Code word of } C_s^i = DO_i + \text{Code word of } C_s^j \text{ for } 1 \leq i \leq p^m \text{ and } i \neq j, \quad \text{EQ.(4)}$$

where j is a certain value of $1 \leq j \leq p^m$ and $DO_i$ (distance offset) values represent a difference between code words of $C_s^j$ and the others. Thus, we can generate code words of all cosets except $C_s^j$ using only DO's and code words of $C_s^j$. For example, DO's to induce code words of $C_s^2$, $C_s^3$, and $C_s^4$ from $C_s^1$ in Table 1 are shown in FIG. 3. Now we know that there are specific constant offset values between a certain $C_s^j$ and the others. This is the unique feature of the parity-check matrix of the RS-based LDPC codes, which leads to an efficient MAG method.

Figure 5:
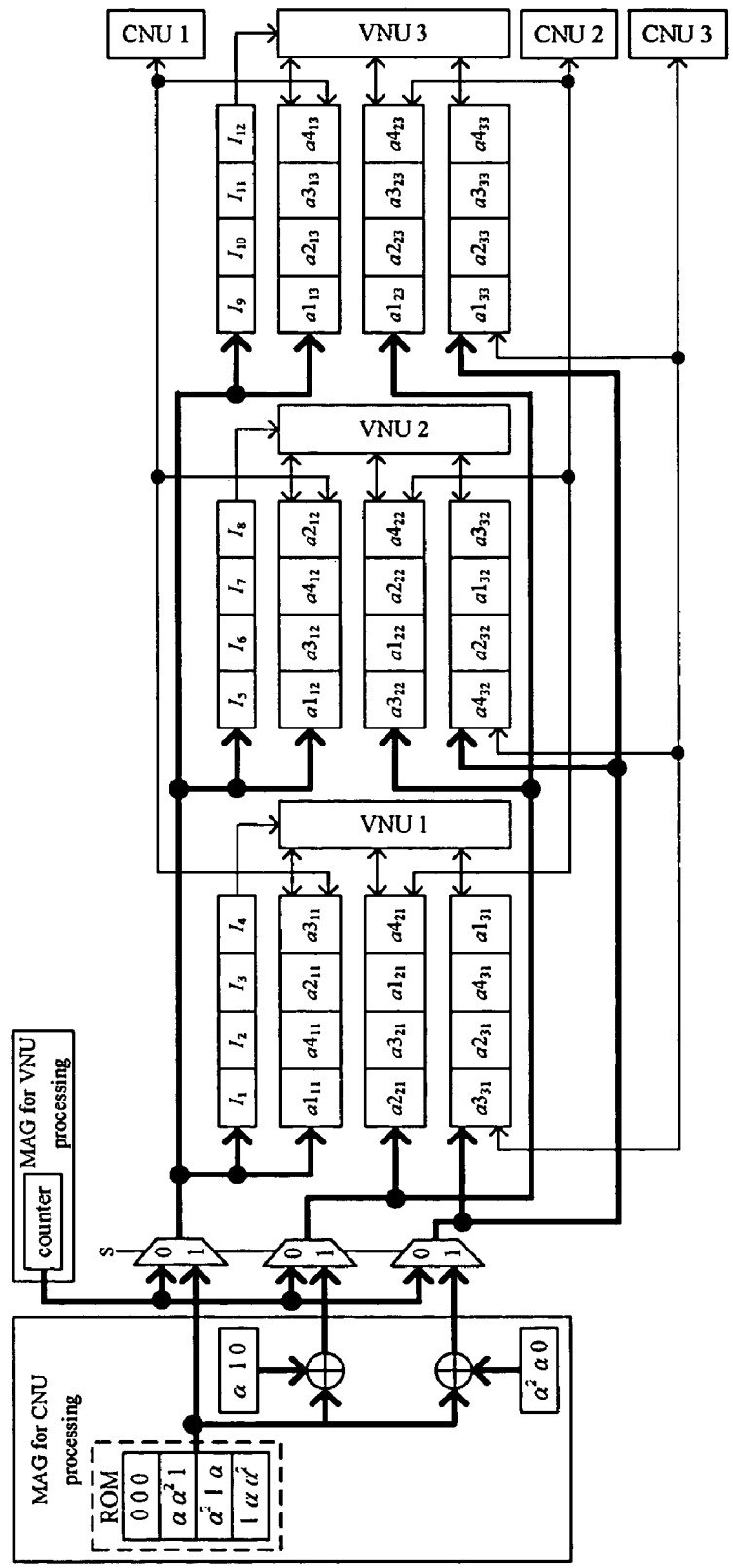
FIG. 5 illustrates the TM RS-based LDPC code decoder architecture for the code in FIG. 4 employing the MAG scheme.

Consider the MAG block design for the TM decoder architecture of the RS-based (3,3)-regular LDPC code of FIG. 1. Each submatrix of the parity-check matrix H is denoted as shown in FIG. 4(a) and each submatrix must be mapped into a memory block to use the MAG method as illustrated in FIG. 4(b). The other submatrices are mapped by the same way. Then we can derive a time-multiplexed decoder architecture utilizing the MAG method as shown in FIG. 5 in which memory addresses for CNU processing are generated by the proposed MAG block while a simple counter is used for VNU processing. In the MAG block for CNU processing, the elements, 0, 1, $\alpha$, and $\alpha^2$ of $GF(2^2)$ are represented by 00, 01, 10, and 11 respectively, so that the memory addresses are generated by the ex-OR ($\oplus$) operation between code word of $C_s^1$ and DO's. $I_i$ denotes the intrinsic channel reliability value. This architecture is obtained by folding a fully parallel implementation, i.e., both $F_V$ (folding factor of VNU) and $F_C$ (folding factor of CNU) are 4, so that 3 CNU's and 3 VNU's are used. The details of how the MAG blocks work are illustrated in Table 2. In other iterations, same operations like the first iteration are processed until a stop criterion is reached.

Consequently, when parity-check matrices of RS-based LDPC codes are not composed of circulant matrices, the presented MAG method derived from EQ. (4) largely simplifies decoder hardware implementation complexity. In other words, a ROM storing code word data of only one coset is enough to generate all memory addresses required for check node processing.

A Method to design High Throughput Time-Multiplexed Decoder Architectures for RS-Based LDPC Codes: Case for 10GBASE-T System In the traditional TM LDPC code decoder architecture, the number of clock cycles required per iteration is proportional to the dimension of submatrices of the parity-check matrix. Thus the submatrix has to be split into smaller ones and the number of CNU's/VNU's increases to reduce the clock cycles required. However splitting submatrix means fragmenting memory in implementation which can sometimes cause serious problems such as memory access conflicts even though multi-port memory is used. Thus the sequential RS-based LDPC code decoder architecture as shown in FIG. 5 can not be used as a solution for a system demanding high decoding throughput LDPC decoder such as a 10GBASE-T system.

The 10GBASE-T system specified by IEEE 802.3an standard has adopted regular (2048, 1723) RS-based LDPC code for the FEC code. The dimension of the parity-check matrix $H_{10G}$ is 384×2048, and column and row weights are 6 and 32, respectively. The size of the submatrix is 64×64. The throughput constraints require 2048 bits to be computed in about 320 ns. A peculiar fact of $H_{10G}$ is that the row weights are more than five times that of column weights. Thus the complexity of each CNU is much larger than that of a VNU since the number of inputs to CNU is 32 while that to a VNU is 6.

In the present invention, SSAU (sum and sign accumulation unit), which computes and stores the sum and sign values of each row during VNU processing, plays a major role to reduce the number of inputs to the CNU and consequently the overall area. Furthermore, since SSAU enables the shortened CNU to compute a portion of each row, it allows an overlapped scheduling between CNU processing and VNU processing, which further reduces the number of clock cycles per iteration.

It is inevitable that lots of messages have to be computed at the same time to meet high throughput. This fact means that low latency shuffle networks are necessary to establish proper connections between memories and processing units. To meet this goal, shuffle networks consisting of switch network composed of deMux's and pre-set routing block are used in the present invention. The pre-set routing block has all necessary interconnection paths and the deMux's steer messages toward proper destinations through one of the paths of the pre-set routing block.

Consider the design of RS-based LDPC code decoder architectures for the 10GBASE-T system. In the present invention, mainly 3 different decoder architectures are developed and will be compared with one another. A first design employs SSAU with $F_C=1$ and $F_V=11$, and a second design is developed using traditional data path mode, i.e., mutually exclusive mode between CNU and VNU processings, with $F_C=6$ and $F_V=6$. A third one is developed by combining of the both. The common feature among the 3 kinds of designs is the use of low latency shuffle networks. As an example, assume that max iteration is 10 and $T_{MR}$, $T_{MW}$, $T_{CNU}$, and $T_{VNU}$ are at most 2 ns. $T_{MR}$, $T_{MW}$, $T_{CNU}$, and $T_{VNU}$ denote the computation times of a memory read, a memory write, a CNU processing, and a VNU processing, respectively. Here we know that each iteration has to be completed in 32 ns.

A First Design Example

Figure 6:
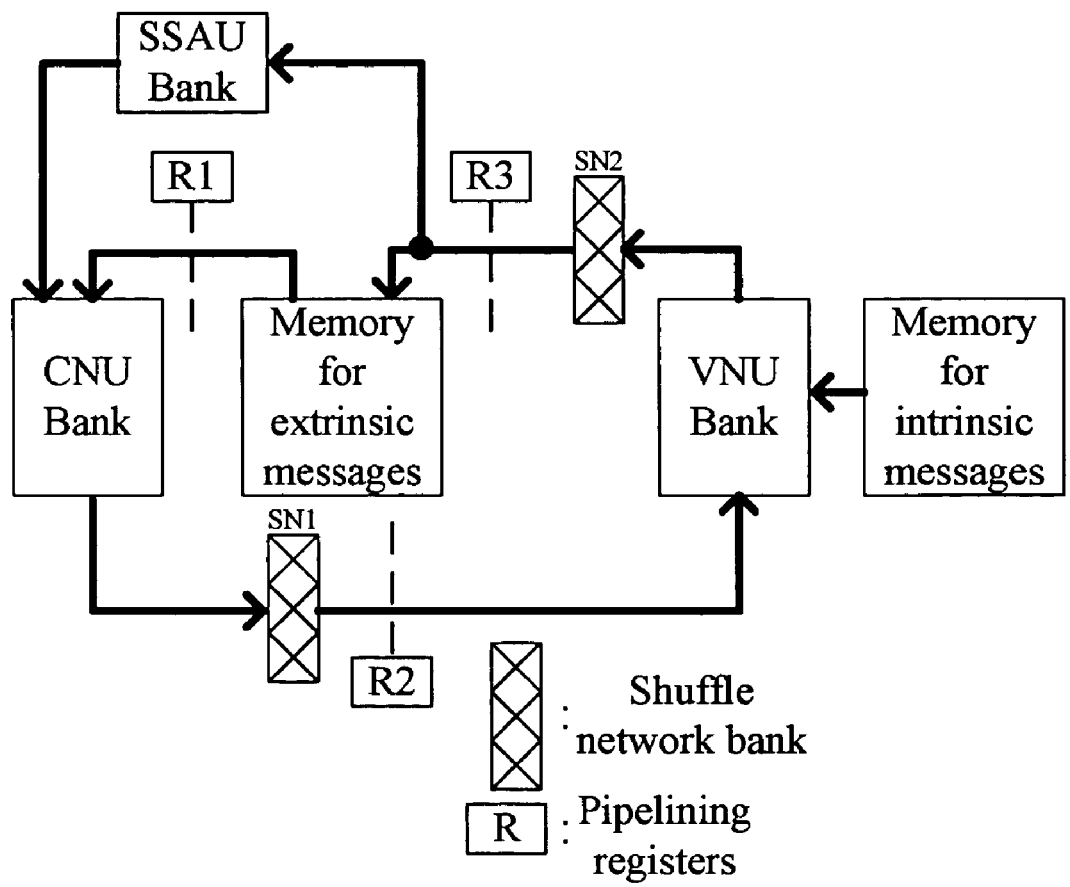
FIG. 6 illustrates data path of the TM RS-based LDPC code decoder architecture employing SSAU (sum and sign accumulation unit).

The first RS-based LDPC code decoder architecture is developed by employing SSAU's. FIG. 6 illustrates the overall data path. In a traditional architecture as shown in FIG. 13(a), decoding process is divided into two mutually exclusive modes—CNU processing mode and VNU processing mode. In each mode, messages need to be first read from memory before processing and written back into memory after processing. While in the present invention, the messages pass from memory along through CNU, VNU, and then SSAU and back to memory. CNU bank is connected to VNU bank via shuffle network bank (SN1) without passing through the memory. The computation time of the critical path is $$T_{critical}=T_{MR}+T_{CNU} \text{ or } T_{VNU}+T_{MW}. \quad \text{EQ.(5)}$$

To reduce the critical path from 4 ns to 2 ns, i.e., to increase clock frequency to 500 MHz, pipelining registers (R1, R2, and R3) are inserted.

Figure 7:
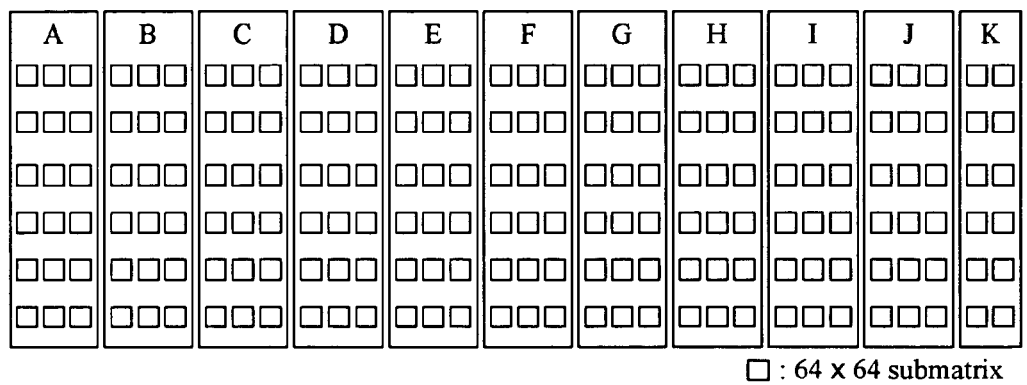
FIG. 7 illustrates how parity-check matrix is divided by $F_C$=1 and $F_V$=11, where $F_C$ and $F_V$ represent the check node unit folding factor and variable node folding factor, and the corresponding decoder schedule.

FIG. 7(a) illustrates how the (384,2048) parity-check matrix consisting of 192 64×64 submatrices is partitioned for desinging a TM decoder architecture with $F_C=1$ and $F_V=11$. Thus, 384 CNU's compute 1152 (=3 messages*384 rows) messages for matrices A to J and 768 (=2*384) messages for matrix K, and 192 VNU's compute 1152 (=6*192 columns) messages for matrices A to J and 768 (=6*128) messages for matrix K. In fact, with $F_C=1$, $F_V$ can be up to 14, i.e., $$2 \text{ ns} \times (F_V+F_C+1) \leq 32 \text{ ns}. \quad \text{EQ.(6)}$$

However there are no benefits with $F_V=14$, 13, and 12 in that the purpose of folding is to reduce the number of hardware functional units by a factor of $F_C$ at the expense of increasing the computation time by a factor of $F_C$ (see, K. K. Parhi, *VLSI Digital Signal Processing Systems Design and Implementation*, John Wiley & Son, Inc., New York, 1999). Thus, $F_V=11$, and time required for each iteration is 2 ns(11+1+1)=26 ns. In 10 iterations, the margin (60 ns=320 ns−260 ns) can be either used for the initialization step or for reducing clock frequency to less than 500 Mhz.

The CNU's complexity can be minimized with these folding factors. With the aid of SSAU's, each CNU requires only 4 inputs, as opposed to 32 inputs required in a traditional architecture. 384 SSAU's compute and accumulate the sum and sign values of 384 rows of the matrices, A to K, while 192 VNU's perform update operations. Thus, after whole VNU processing is completed, each SSAU stores the sum and sign values of each row of the whole parity-check matrix. This is the reason that each CNU can compute a portion of each row. In other words, the number of inputs to CNU can be only 4.

Figure 8:
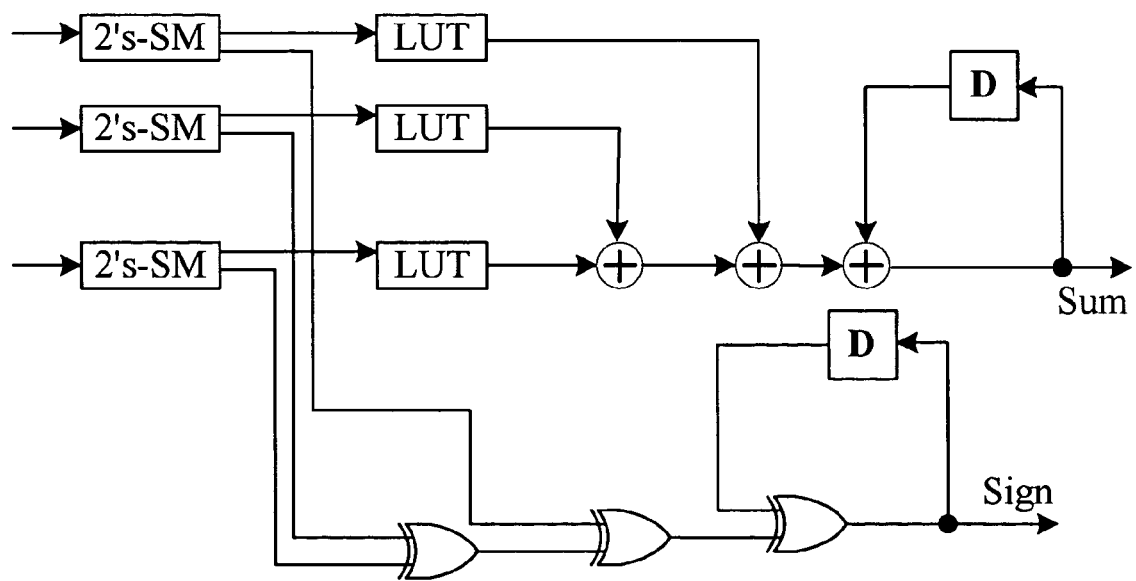
FIG. 8 illustrates a 3 input SSAU.
Figure 9:
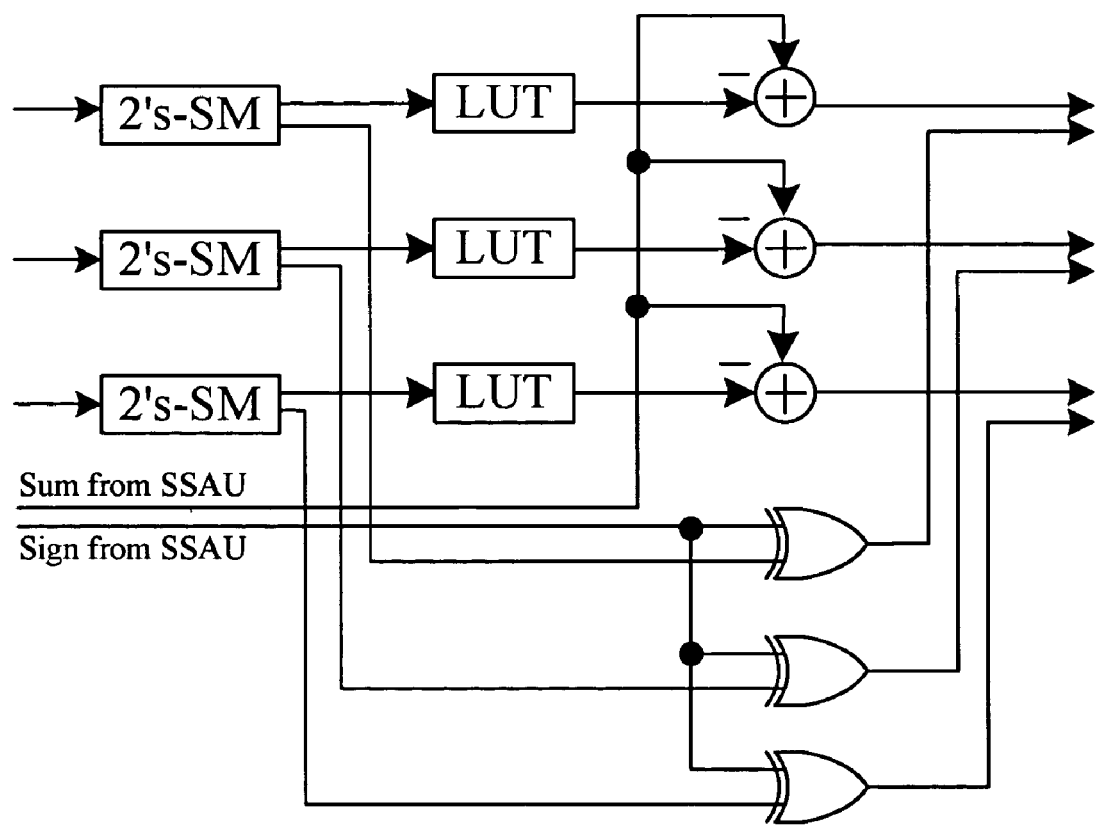
FIG. 9 illustrates a CNU (check node unit) tied to a SSAU.
Figure 10:
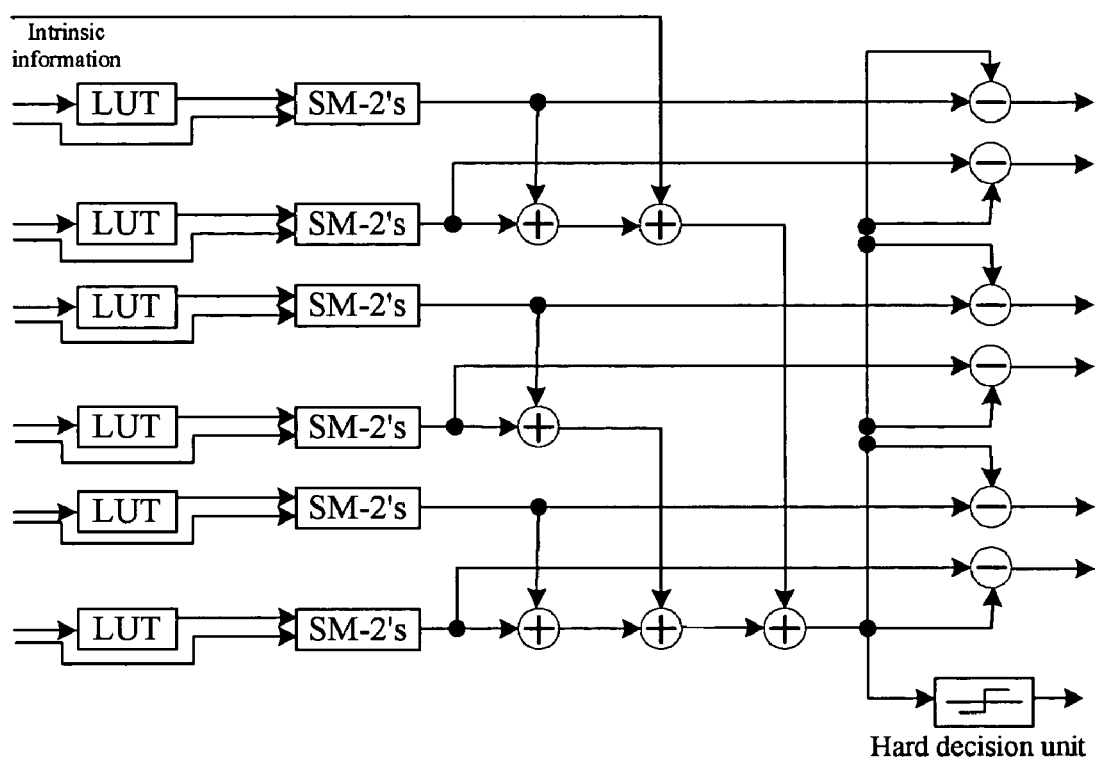
FIG. 10 illustrates a 6 input VNU (variable node unit).

FIG. 7(b) illustrates the decoder schedule with $F_C=1$ and $F_V=11$. As explained, SSAU can start processing right after VNU processing, e.g., each SSAU computes the sum and sign values of each row of matrix A after VNU processing for the A is done. Since $F_V$ is 11, SSAU has 3 inputs as shown in FIG. 8. CNU has 4 inputs where 3 inputs are extrinsic messages updated from previous VNU processing and the other one comes from the SSAU as illustrated in FIG. 9. FIG. 10 shows an example of a VNU design. In all types of functional units, a data format conversion block, either from two's (2's) complement number format to sign-magnitude (SM) number format and vice versa, exists. The look-up-table (LUT) is used for reference of the function, log(tan h(-x/2-)), which is part of the belief propagation decoding algorithm.

Figure 11:
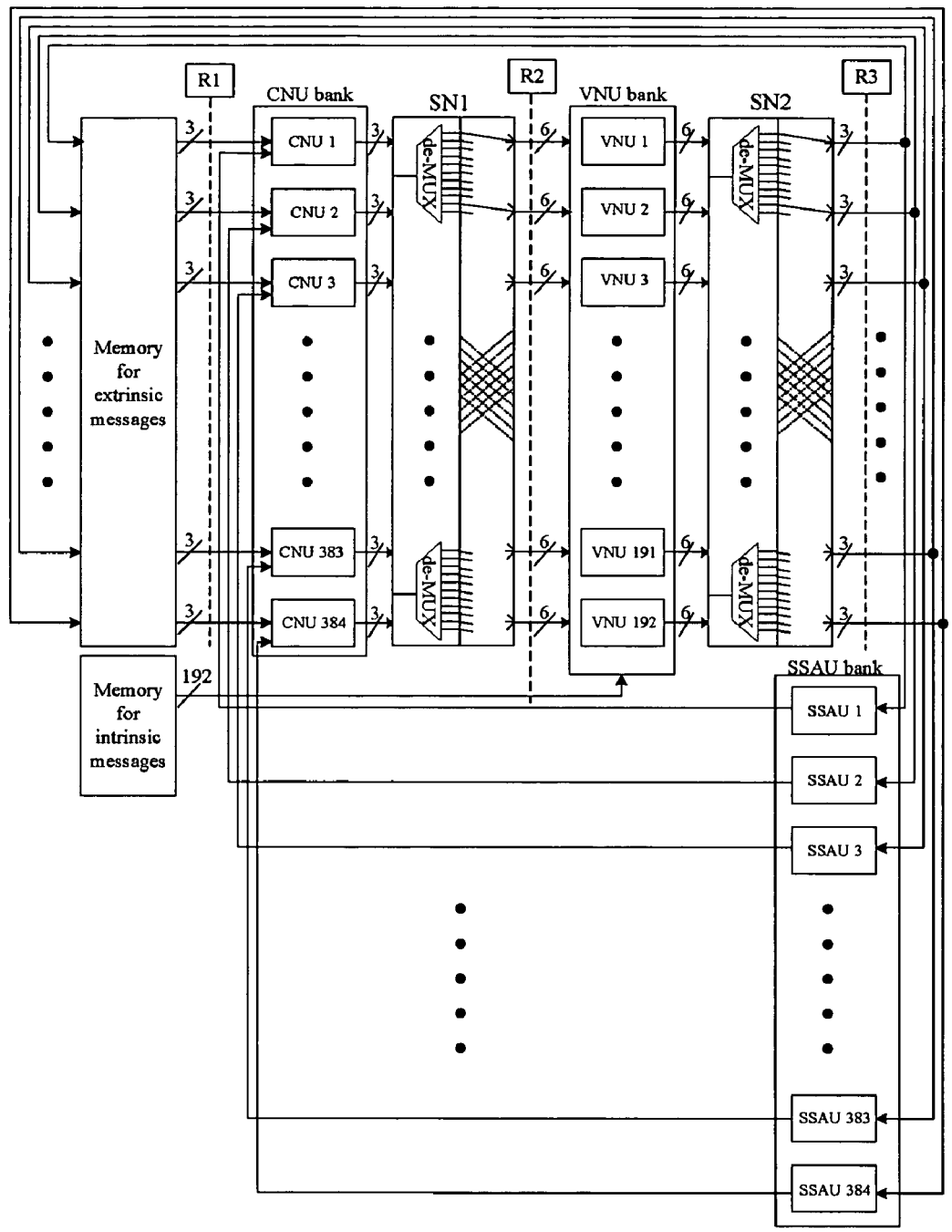
FIG. 11 illustrates overall architecture of TM RS-based LDPC code decoder architecture employing SSAU.

FIG. 11 shows the overall decoder architecture, where the size of the memory is 11 words×1152 messages. Each word stores the matrices, A to K. For example, let $A_i$ be ith row of the A, where $1 \leq i \leq 384$, then the word for the A in the memory stores $(A_1 \ A_2 \cdot A_{384})$, where each $A_i$ contains 3 messages, to establish a fixed connection between the memory and CNU bank without a shuffle network. However, since the memory configuration is oriented for only CNU processing, two shuffle network banks are required for other data flows. The first shuffle network bank (SN1) rearranges messages for the following VNU processing, which is located between CNU bank and R2. The second shuffle network bank (SN2) rearranges messages so that the rearranged messages are stored in the memory properly for the CNU processing of the next iteration.

Figure 12:
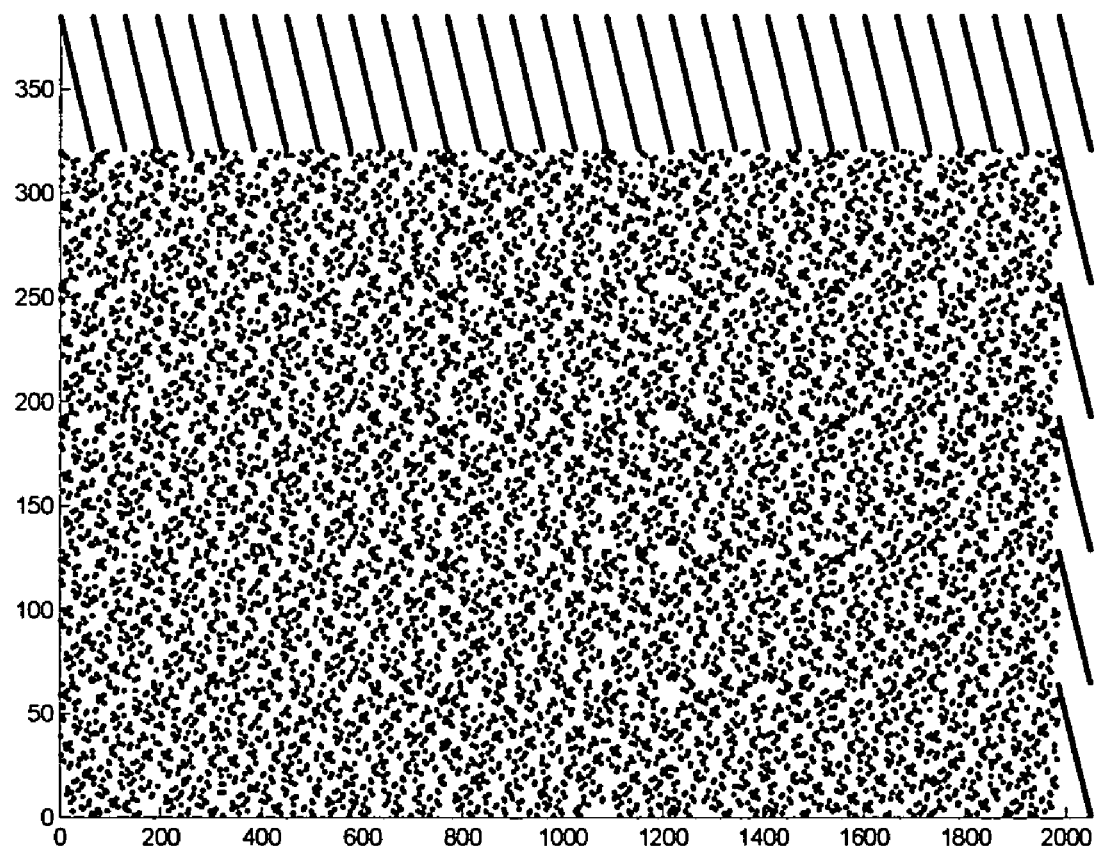
FIG. 12 illustrates rearranged (2048,1723) RS-based (6,32)-regular LDPC code.

For SN1, since the $H_{10G}$ is divided into 11 matrices and each CNU in CNU bank has 3 outputs, 1152 (=3*384) 1-to-11 deMux's are needed. However, if the $H_{10G}$ of FIG. 2 is modified by column swapping to convert submatrices located in the top into identity matrices as illustrated in FIG. 12, fixed wirings can be used for those identity matrices with no aid of the shuffle network, so that 1152 deMux's can be reduced to 960 (=3*(384−64)). Hence, the pre-set routing block has 10560 (=11*960) input pins which are connected to 960 output pins. In other words, each pin of 960 output pins has 11 wires and only valid data is established in one wire at each clock cycle. Similarly, SN2 has 960 (=5*192) 1-to-11 deMux's and pre-set routing block which has 10560 input pins and 960 output pins.

A Second Design Example

FIG. 13(a) illustrates a typical data path of conventional LDPC decoder. There are 4 sets of pipelining registers so that the critical path is 2 ns. FIG. 13(b) illustrates that the $H_{10G}$ is divided by $F_C=6$ and $F_V=6$. These folding factors lead to the smallest number of both CNU's and VNU's, so that 64 CNU's and 384 VNU's are used. FIG. 13(c) illustrates the decoder schedule. CNU/VNU processing are mutually exclusive in scheduling, so that one iteration requires 16 clock cycles. CNU processing takes 6 clock cycles, and VNU processing also takes 6 clock cycles and other 4 cycle cycles are required for pipelining registers.

Figure 14:
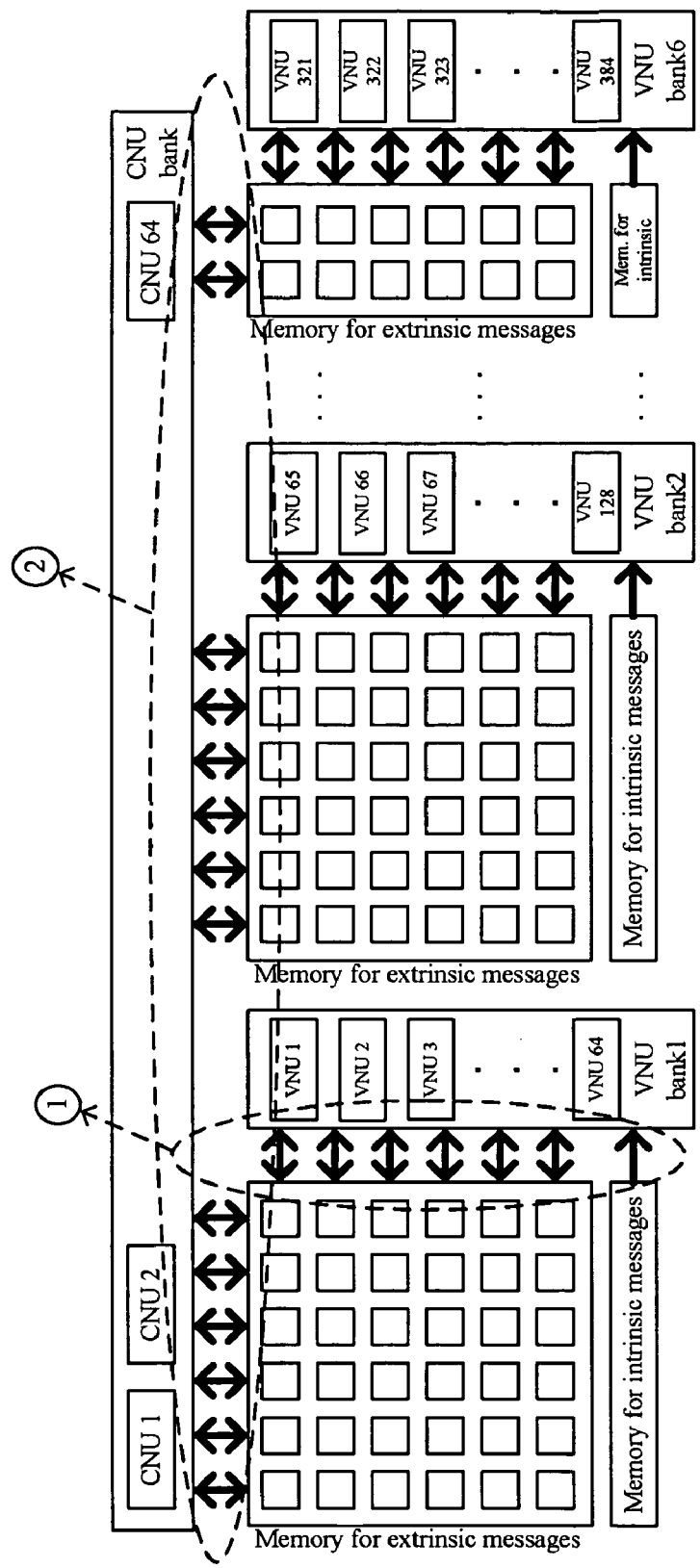
FIG. 14 illustrates the overall architecture of the second design example.
Figure 15:
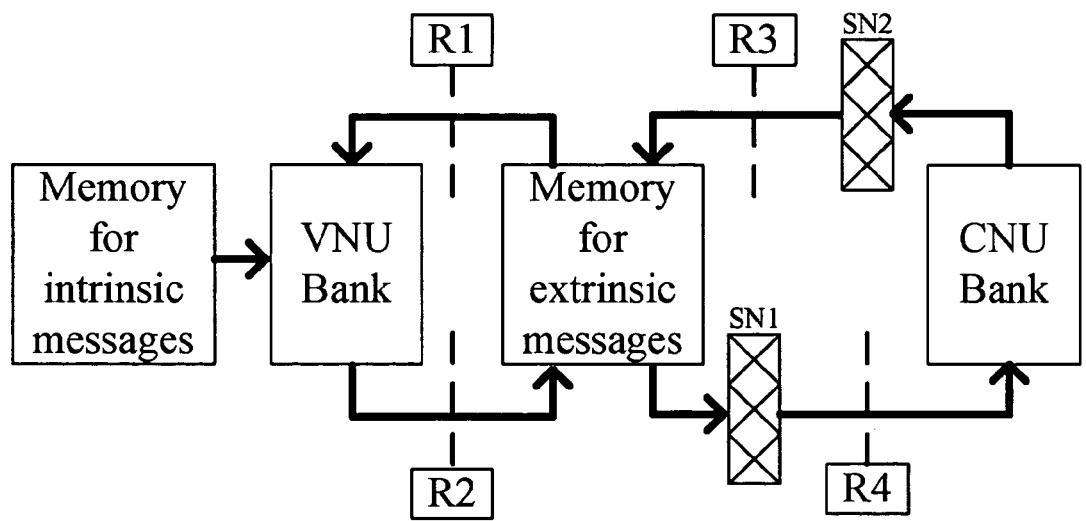
FIG. 15 illustrates alternative data path of the second design example.

FIG. 14 shows the overall decoder architecture. Memories for extrinsic messages are fragmented, so that there are 192 memories and each memory's size is 1 word×64 messages. Note that there can be two versions of the decoder architecture. One is that the interconnection between messages and CNU's is implemented by fixed wirings and shuffle networks are used for establishing the interconnection between messages and VNU's as shown in FIG. 13(a). The other is implemented conversely as shown in FIG. 15. Let us call these architectures as FCA (Fixed connection between CNU's and messages Architecture) and FVA (Fixed connection between VNU's and messages Architecture), respectively.

Figure 16:
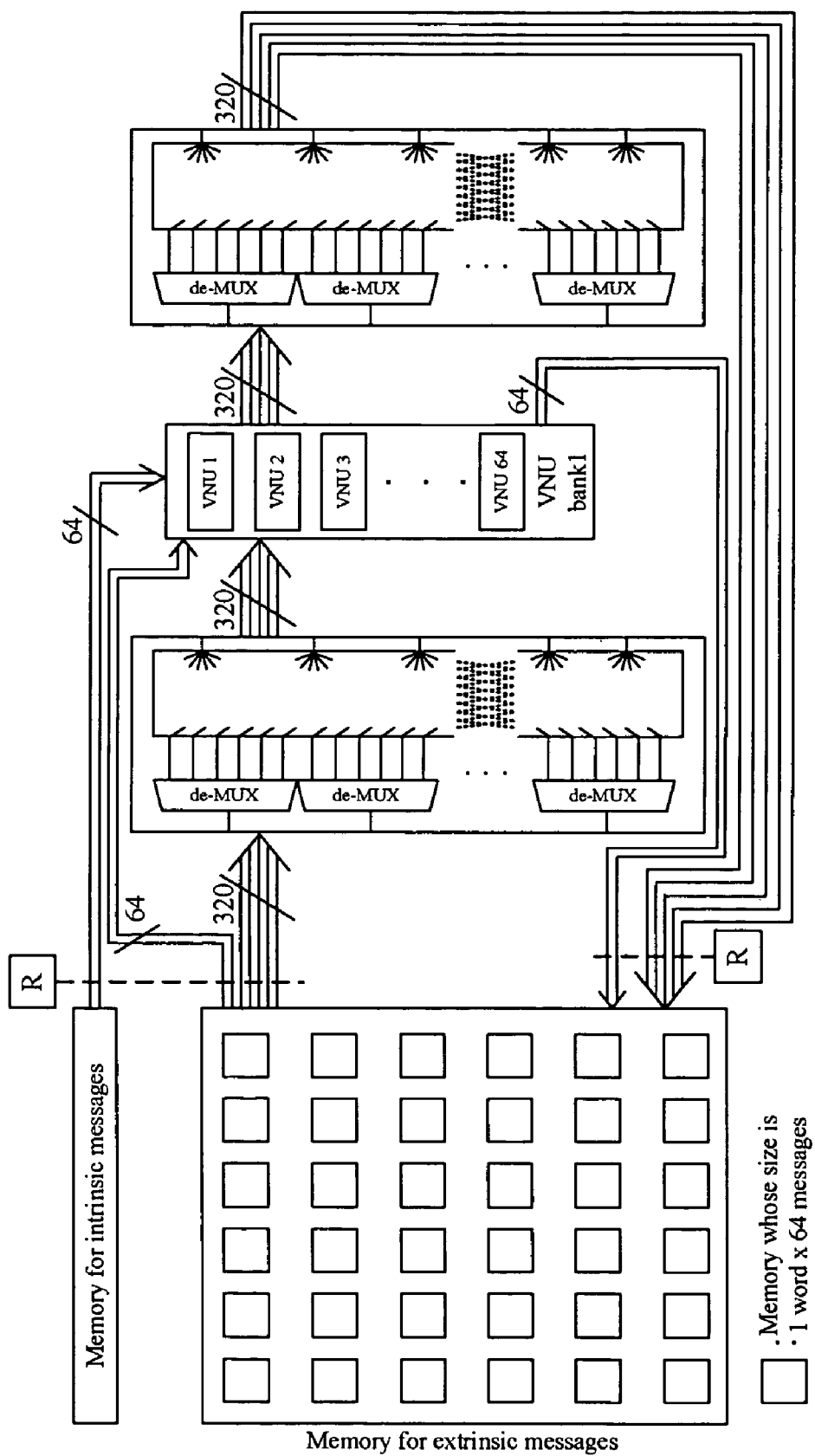
FIG. 16 illustrates the detail data path between memory and VNU bank1.
Figure 17:
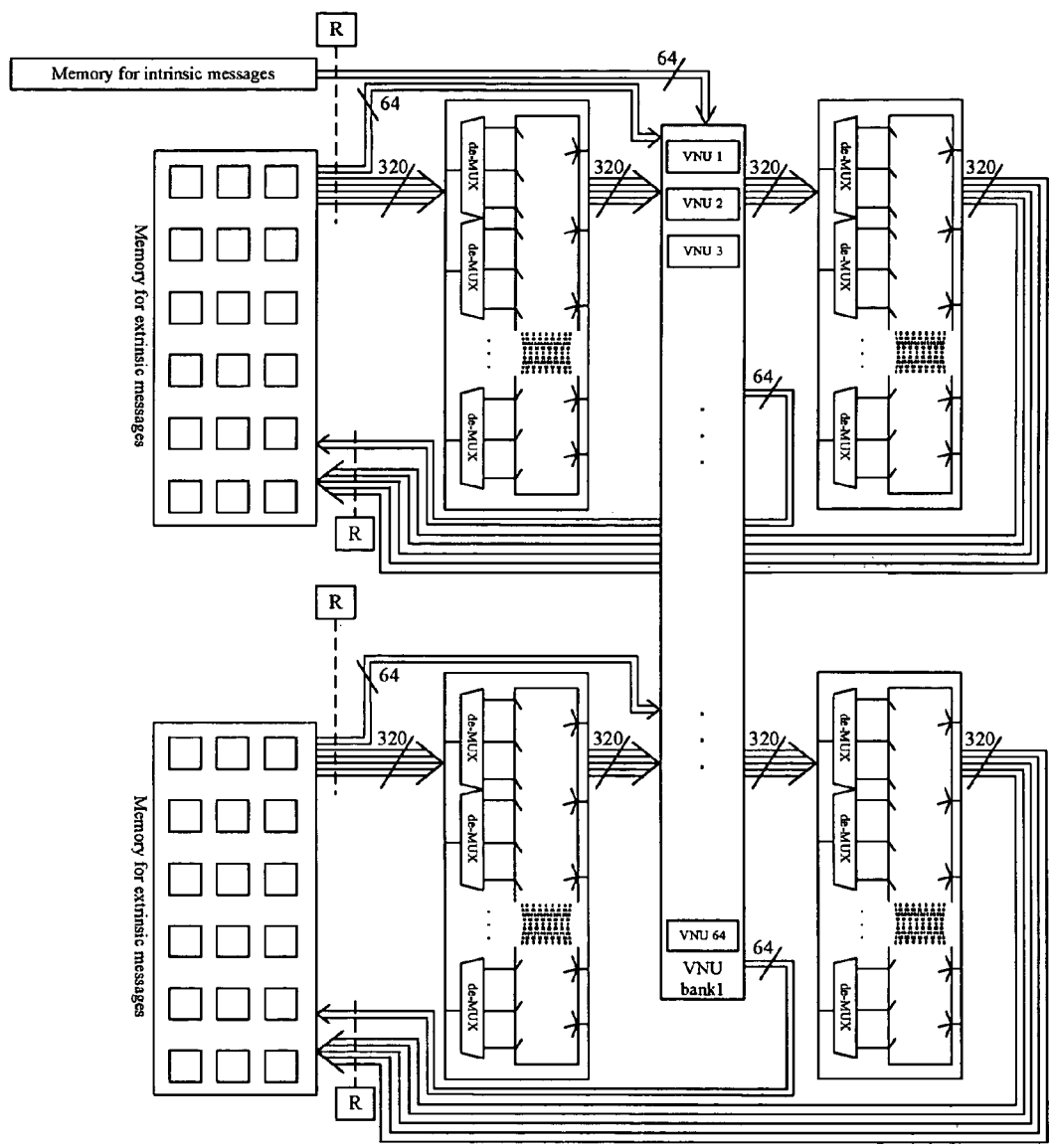
FIG. 17 illustrates alternative data path between memory and VNU bank1 for reducing shuffle network complexity.

In FCA, the routing of the second dotted-circle part in FIG. 14 is fixed and 6 shuffle networks are needed between memories and VNU banks. FIG. 16 illustrates a detailed version of the first dotted-circle part in FIG. 14. For the switch network between memory and VNU bank1, since 6 different sets of messages are computed in VNU bank1, 320 1-to-6 deMux's are needed and the pre-set routing block has 1920 input pins and 320 output pins. Each output pin has 6 wires and only one wire is active at each clock cycle. The shuffle network between VNU bank1 and memory has same resource cost except different routing. Note that 64 messages are connected to VNU bank1 with fixed wirings due to the rearranged $H_{10G}$. FIG. 17 illustrates an alternative design of FIG. 16 such that the complexity of each shuffle network is reduced by about 50%. In first 3 clock cycles, VNU bank1 computes messages in the upper memories and, in other 3 clock cycles, VNU bank1 computes messages of the lower memories. Thus, in each switch network, 320 1-to-3 deMux's are used and the pre-set routing block has 960 input pins and 320 output pins, where each output pin has 3 wires. However, in this architecture, complexity of the shuffle network is reduced at the expense of cost increase of other routings and pipelining registers.

Figure 18:
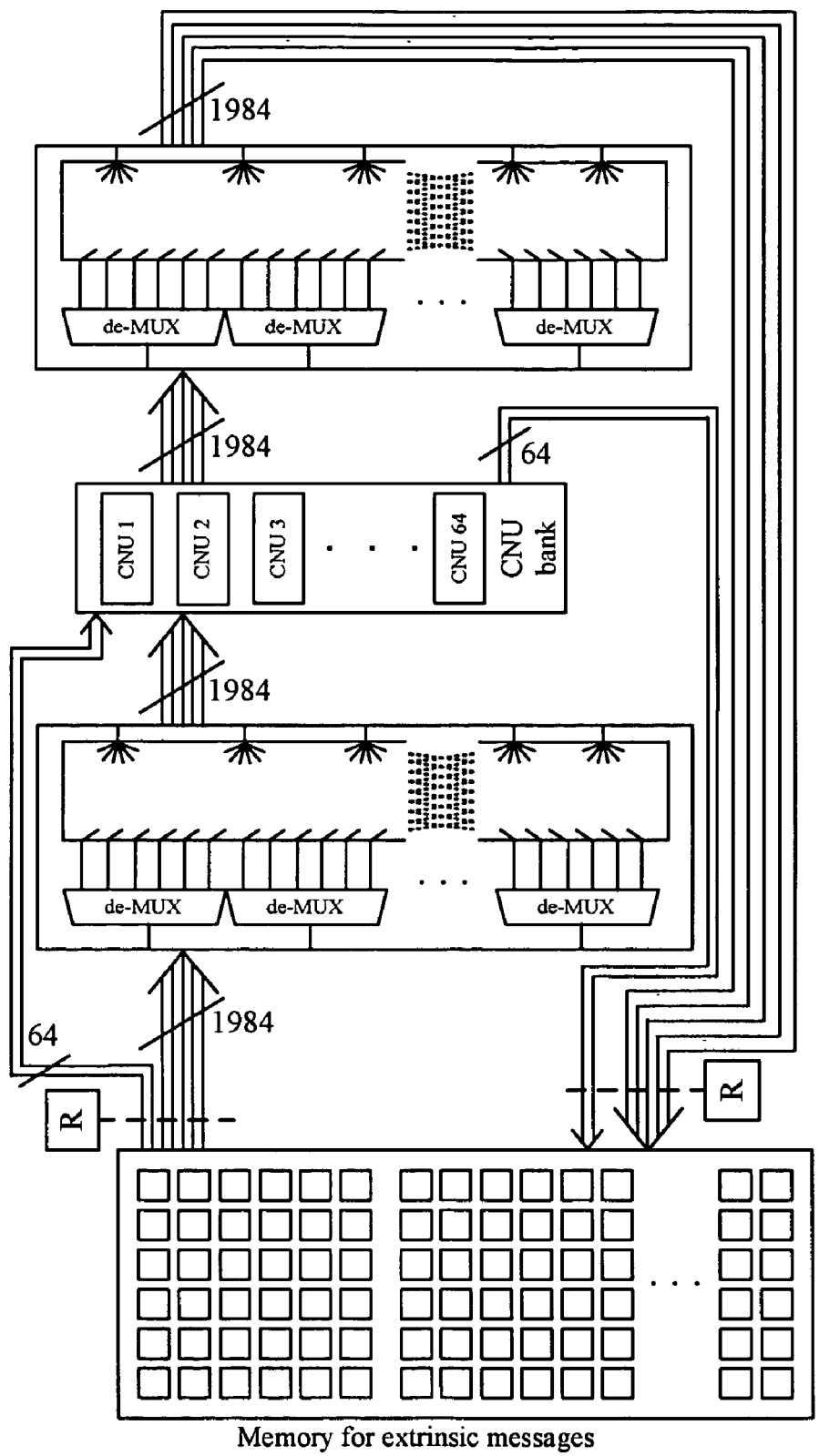
FIG. 18 illustrates the detail data path between memory and CNU bank.

In FVA, all the routings between memories and VNU banks is fixed and 1 shuffle network is used between memories and CNU banks. FIG. 18 illustrates a detailed version of the second dotted-circle part in FIG. 14. The shuffle network between memory and CNU has 1984 1-to-6 deMUX's and the pre-set routing block has 11904 input pins and 1984 output pins. The shuffle network between CNU and memory has same complexity except different routing in the pre-set routing block. As the architecture of FIG. 16 can be unfolded as shown in 17, the architecture of FIG. 18 can be similarly modified to reduce SN's complexity by 50% at the expense of other costs.

A Third Design Example

Figure 19:
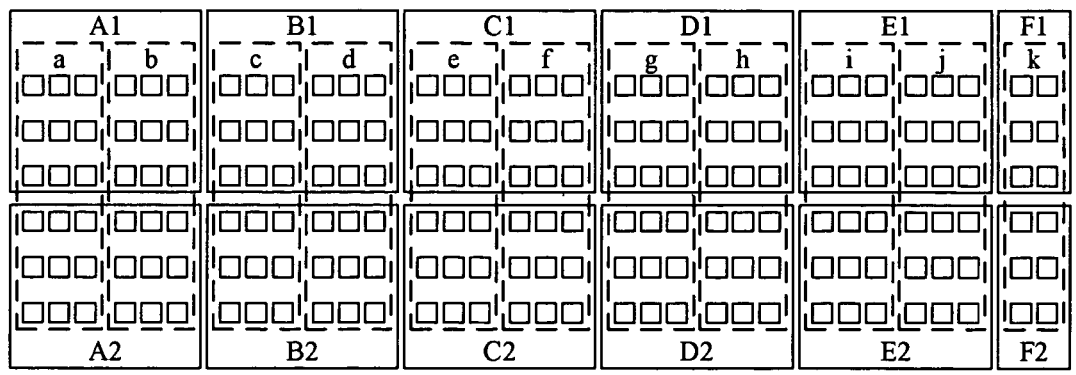
FIG. 19 illustrates how parity-check matrix is partitioned for $F_C$=2, $F_V$=11 and decoder schedule of the third design example.

The third design is a modified version of the architecture of FIG. 6 such that $F_C$ is increased by 1, i.e., from 1 to 2, as illustrated in FIG. 19(a). FIG. 19(b) shows the decoder schedule. Note that, due to $F_C=2$, 192 CNU's compute 1152 messages and, hence the number of inputs to CNU is increased to 7 from 4.

Figure 20:
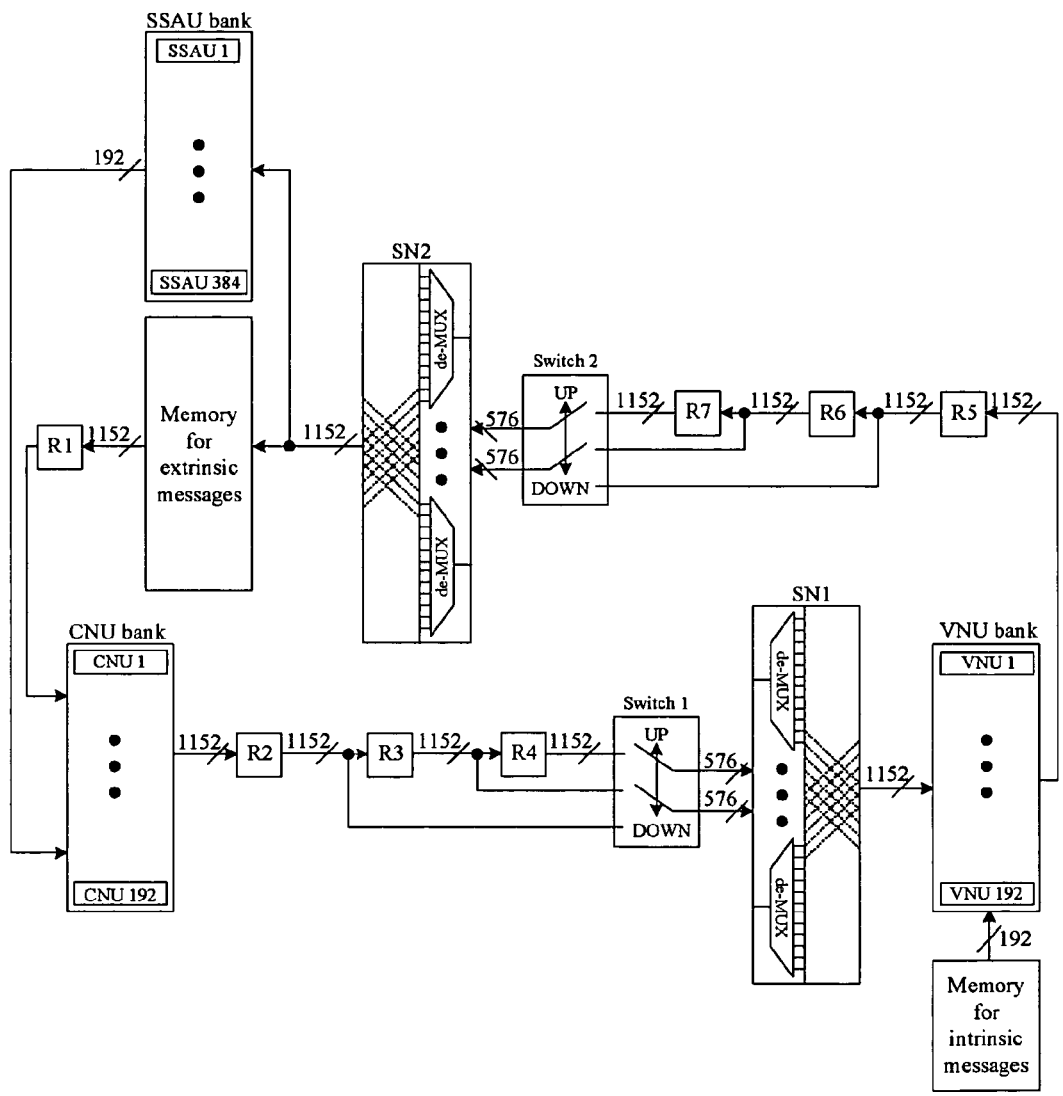
FIG. 20 illustrates overall architecture of the third design example.

FIG. 20 shows the overall decoder architecture, where the size of the memory for extrinsic messages is 12 words×1152 messages. To compute messages of each matrix marked by lower case in FIG. 19(a) by VNU bank, two clock cycles are needed. Similarly, to store messages into memory properly, two clock cycles are needed for matrices marked by upper case in FIG. 19(a), i.e., matrices A1 and A2, and so on. This facts cause more registers than the first architecture of FIG. 6. FIG. 21 illustrates overall register data flow and switch direction. Note that each switch bar passes 576 messages among 1152 messages to SN. Each SN is composed of 960 1-to-12 deMux's and pre-set routing block having 11529 input pins and 1152 output pins.

Complexity Comparison

In this section, we compare the complexity for three different RS-based LDPC code decoder architectures, which are developed for the 10GBASE-T. The first one is time-multiplexed by $F_C=1$ and $F_V=11$ and employs SSAU. The second one is developed based on the traditional data path. Both $F_C$ and $F_V$ are 6. The third one is derived from the first one by increasing $F_C$ from 1 to 2.

Table 3 lists comparison results of the three decoder architectures in terms of hardware cost of processing units and complexity of shuffle networks. The first design requires 384 CNU's, 192 VNU's and 384 SSAU's. One CNU has 3 LUT's, 3 adders and 3 ex-OR's, and one VNU has 6 LUT's and 12 adders, and one SSAU has 3 LUT's, 3 adders and 3 ex-OR's. A total of 3456 LUT's, 4608 adders and 2304 ex-OR's are used. For the second design, 64 CNU's, 384 VNU's and no SSAU are needed, where one CNU is composed of 32 LUT's, 63 adders and 63 ex-OR's. VNU is same as that of the first design. Entirely, 4352 LUT's, 8640 adders and 4032 ex-OR's are used. For the third design, 192 CNU's, 192 VNU's and 384 SSAU's are needed. Same VNU is used and one CNU consists of 6 LUT's, 6 adders and 6 ex-OR's. Same SSAU is used. Totally, 3456 LUT's, 4608 adders and 2304 ex-OR's are used, which are same as that of the first design. The comparison result shows that the decoding architecture (the first and third ones) with the aid of SSAU has much less hardware overhead than traditional designs (the second one). With comparison between the first design and the second design, the number of LUT is reduced by 20.59% the number of adders is reduced by 46.67%, the number of ex-OR is reduced by 42.86%, and the number of registers is reduced by 55.88%. Although derived from the first design, the third design consumes much more registers because those registers (R3, R4, R6 and R7) are required for temporal message storage.

In the first design, there are two shuffle networks. Each shuffle network has 960 1-to-11 deMUX's. A pre-set routing block has 10560 inputs, so that there are 10560 pre-set wires. In the second design, FCA has 6 VNU banks and each bank has two shuffle networks. From VNU bank 1 to VNU bank 5, each shuffle network requires 320 1-to-6 deMUX's. A pre-set routing block has 1920 wires. For VNU bank 6, each shuffle network is composed of 320 1-to-2 deMUX's and 640 pre-set wires. In FVA, each shuffle network requires 1984 1-to-6 deMUX's and 11904 pre-set wires. In the third design, there are two shuffle networks. Each shuffle network has 1152 1-to-12 deMUX's and 13824 pre-set wires.

The first design uses one 11 words×1152 messages size memory and the third design needs one 12 words×1152 messages size memory. However, the second design uses 192 1 words×64 messages size memory. These memories are fragmented, so that the second design needs the highest cost in terms of memory.

CONCLUSIONS

A method to design a MAG block for TM RS-based LDPC code decoder architectures has been presented. For high throughput application, specifically 10GBASE-T system, three TM RS-based LDPC coder decoder architectures have been presented. It has been shown that the first design is the most competitive. By introducing SSAU, CNU's complexity is reduced significantly and overlapped decoding is achieved.

While various embodiments of the present invention have been described above, it should be understood that they have been presented by way of example only, and not limitation. It will be understood by those skilled in the art that various changes in form and details can be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A Reed-Solomon code based low-density parity check code decoder, comprising:
 a check node unit (CNU) bank including a plurality of CNUs;
 a variable node unit (VNU) including a plurality of VNUs;

a first memory address generator for CNU processing including a reference memory address block and an offset memory address block to generate a memory address from an exclusive-or of a reference memory address and an offset memory address;
a second memory address generator for VNU processing including a counter;
a memory unit addressed by a memory address generated by one of the first and second memory address generators;
a data transfer channel between the memory unit and the VNU bank, and
a data transfer channel between the memory unit and the CNU bank.

2. The decoder of claim 1, further including at least one multiplexor to receive memory addresses from the first and second memory address generators and to select one of the addresses to address the memory unit.

3. An integrated circuit to implement a Reed-Solomon (RS) code based low-density parity check code decoder, comprising:
a check node unit (CNU) bank including a plurality of CNUs;
a variable node unit (VNU) bank including a plurality of VNUs;
a first memory address generator for CNU processing including a reference memory address block and an offset memory address block to generate a memory address from an exclusive-or of a reference memory address and an offset memory address;
a second memory address generator for VNU processing including a counter;
a memory unit addressed by a memory address generated by one of the first and second memory address generators;
a data transfer channel between the memory unit and the VNU bank; and
a data transfer channel between said memory unit and said CNU bank.

4. The integrated circuit of claim 3, further including at least one multiplexor to receive memory addresses from the first and second memory address generators and to select one of the addresses to address the memory unit.

5. A decoder for decoding a low-density parity check (LDPC) code, comprising:
(a) a CNU bank comprising a plurality of check node units (GNU's),
(b) a VNU bank comprising a plurality of variable node units (VNU's),
(c) a sign and sum accumulation unit (SSAU) bank comprising a plurality of SSAU units,
(d) a first memory bank for storing extrinsic messages,
(e) a second memory bank for storing intrinsic messages,
(f) a first switch network transferring data from the said CNU bank to the said VNU bank,
(g) a second switch network transferring data from the said VNU bank to the said first memory bank and to the said sign and sum accumulation unit bank,
(h) check node units coupled to the first memory bank and to the SSAU unit bank, comprising:
i. at least one lookup table (LUT),
(i) variable node units coupled to the first switch network and the said second memory bank,
(j) sign and sum accumulation unit (SSAU), for accumulating sign and sum of the check node messages, coupled to the second switch network comprising:
i. one sign accumulation unit and one sum accumulation unit.

6. The decoder of claim 5 which is pipelined by placing at least one register in an inter-connection path carrying data from one bank to another bank.

7. The decoder of claim 5 where the first and second switch networks contain a plurality of demultiplexers.

8. The decoder of claim 5 wherein the connecting path from the CNU bank to the first switch network contains at least two registers, and the paths from the VNU bank to the SSAU and to the first memory bank contain at least two registers.

9. The decoder of claim 5 used for a Ethernet over copper application.

10. An integrated circuit having a substrate and a decoder for low-density parity check code disposed on said substrate, said decoder comprising:
(a) a CNU bank comprising a plurality of check node units (CNU's),
(b) a VNU bank comprising a plurality of variable node units (VNU's),
(c) a sign and sum accumulation unit (SSAU) bank comprising a plurality of SSAU units,
(d) a first memory unit for storing extrinsic messages,
(e) a second memory unit for storing intrinsic messages,
(f) a first switch network transferring data from the said CNU bank to the said VNU bank, a second switch network transferring data from the said VNU bank to the said first memory bank and to the said sign and sum accumulation unit bank,
(g) check node units coupled to the first memory bank and to the SSAU unit bank, comprising:
i. at least one lookup table (LUT),
(h) variable node units coupled to the first switch network and the said second memory bank,
(i) sign and sum accumulation unit (SSAU), for accumulating sign and sum of the check node messages, coupled to the second switch network comprising:
i. one sign accumulation unit and one sum accumulation unit.

11. The integrated circuit of claim 10 which is pipelined by placing at least one register in an interconnection path carrying data from one bank to another bank.

12. The integrated circuit of claim 10 where the first and second switch networks contain a plurality of demultiplexers.

13. The integrated circuit of claim 10 wherein the connecting path from the CNU bank to the first switch network contains at least two registers, and the paths from the VNU bank to the SSAU and to the first memory bank contain at least two registers.

14. The integrated circuit of claim 10 used for a Ethernet over copper application.

15. A decoder for decoding a low-density parity check (LDPC) code, comprising:
(a) a CNU bank comprising a plurality of check node units (CNU's),
(b) a VNU bank comprising a plurality of variable node units (VNU's),
(c) a first memory bank for storing extrinsic messages, coupled to the said CNU bank,
(d) a second memory bank, for storing intrinsic messages, whose output is coupled to the VNU bank,
(e) a first switch network, transferring data from the said first memory bank to the said VNU bank, comprising a plurality of demultiplexers,
(f) a second switch network, transferring data from the said VNU bank to the said first memory bank, comprising a plurality of demultiplexers, (g) check node units coupled to the said first memory bank,
(h) variable node units coupled to the said first switch network and the said second memory bank.

16. The decoder of claim 15 which is pipelined by placing at least one register in an inter-connection path carrying data from one bank to another bank.

17. The decoder for claim 15 used for a Ethernet over copper application.

18. An integrated circuit having a substrate and a decoder for a low-density parity check code disposed on said substrate, said decoder comprising:
   (a) a CNU bank comprising a plurality of check node units (CNU's),
   (b) a VNU bank comprising a plurality of variable node units (VNU's),
   (c) a first memory bank for storing extrinsic messages, coupled to the said CNU bank,
   (d) a second memory bank, for storing intrinsic messages, whose output is coupled to the VNU bank,
   (e) a first switch network, transferring data from the said first memory bank to the said VNU bank, comprising a plurality of demultiplexers,
   (f) a second switch network, transferring data from the said VNU bank to the said first memory bank, comprising a plurality of demultiplexers,
   (g) check node units coupled to the first memory bank,
   (h) variable node units coupled to the said first switch network and the said second memory bank.

19. The integrated circuit of claim 18 which is pipelined by placing at least one register in an interconnection path carrying data from one bank to another bank.

20. The integrated circuit for claim 18 used for a Ethernet over copper application.

21. A decoder for decoding a low-density parity check (LDPC) code, comprising:
   (a) a CNU bank comprising a plurality of check node units (CNU's),
   (b) a VNU bank comprising a plurality of variable node units (VNU's),
   (c) a first memory bank for storing extrinsic messages, coupled to the said VNU bank,
   (d) a second memory bank, for storing intrinsic messages, whose output is coupled to the VNU bank,
   (e) a first switch network, transferring data from the said first memory bank to the said GNU bank, comprising a plurality of demultiplexers,
   (f) a second switch network, transferring data from the said CNU bank to the said first memory bank, comprising a plurality of demultiplexers,
   (g) check node units coupled to the first switch network,
   (h) variable node units coupled to the said first memory bank and the said second memory bank.

22. The decoder of claim 21 which is pipelined by placing at least one register in an inter-connection path carrying data from one bank to another bank.

23. The decoder for claim 21 used for a Ethernet over copper application.

24. An integrated circuit having a substrate and a decoder for a low-density parity check code disposed on said substrate, said decoder comprising:
   (a) a CNU bank comprising a plurality of check node units (CNU's),
   (b) a VNU bank comprising a plurality of variable node units (VNUs),
   (c) a first memory bank for storing extrinsic messages, coupled to the said VNU bank,
   (d) a second memory bank, for storing intrinsic messages, whose output is coupled to the VNU bank,
   (e) a first switch network, transferring data from the said first memory bank to the said CNU bank, comprising a plurality of demultiplexers,
   (f) a second switch network, transferring data from the said CNU bank to the said first memory bank, comprising a plurality of demultiplexers,
   (g) check node units coupled to the first switch network,
   (h) variable node units coupled to the said first memory bank and the said second memory bank.

25. The integrated circuit of claim 24 which is pipelined by placing at least one register in an interconnection path carrying data from one bank to another bank.

26. The integrated circuit for claim 24 used for a Ethernet over copper application.

* * * * *